US009999152B2

United States Patent
Kang et al.

(10) Patent No.: US 9,999,152 B2
(45) Date of Patent: Jun. 12, 2018

(54) DISPLAY DEVICE

(71) Applicant: LG ELECTRONICS INC., Seoul (KR)

(72) Inventors: Hyunjung Kang, Seoul (KR); Jeonghun Han, Seoul (KR); Kyoungjoon Lee, Seoul (KR); Chunsoo Chang, Seoul (KR); Munhwan Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days. days.

(21) Appl. No.: 15/333,986

(22) Filed: Oct. 25, 2016

(65) Prior Publication Data

US 2017/0118859 A1    Apr. 27, 2017

(30) Foreign Application Priority Data

Oct. 27, 2015  (KR) .......................... 10-2015-0149346
Mar. 14, 2016  (KR) .......................... 10-2016-0030467

(51) Int. Cl.
*G06F 1/16*    (2006.01)
*H05K 5/00*    (2006.01)
(Continued)

(52) U.S. Cl.
CPC ..... *H05K 7/1427* (2013.01); *G02F 1/133308* (2013.01); *G02F 1/133385* (2013.01);
(Continued)

(58) Field of Classification Search
CPC . G06F 1/1601–1/1611; G06F 1/1613–1/1698; G06F 1/18–1/189;
(Continued)

(56) References Cited

U.S. PATENT DOCUMENTS

2006/0098398 A1*  5/2006  Kim ...................... G06F 1/1601
                                                361/679.22
2008/0165496 A1*  7/2008  Kang ................. G02F 1/133308
                                                361/692

(Continued)

FOREIGN PATENT DOCUMENTS

EP        1903375 A1    3/2008
JP     2010-256702 A   11/2010

*Primary Examiner* — Anthony Haughton
*Assistant Examiner* — Razmeen Gafur
(74) *Attorney, Agent, or Firm* — Birch, Stewart, Kolasch & Birch, LLP

(57) ABSTRACT

A display device including a display panel; a rear frame in a rear of the display panel; and a front frame positioned between the display panel and the rear frame and coupled with the display panel and the rear frame, the front frame including a plate portion facing the display panel and a side frame formed at a side or an edge of the plate portion. Further, the side frame includes a first side wall adjacent to a side of the display panel and extended from the plate portion; a second side wall; a first bending portion extended from the first side wall and connecting the first side wall to a first end of the second side wall; a second bending portion extended from the other end of the second side wall and bent from the second side wall toward the rear frame or the front frame.

20 Claims, 37 Drawing Sheets

(51) Int. Cl.
    *H05K 7/00*         (2006.01)
    *H05K 7/14*         (2006.01)
    *H05K 7/20*         (2006.01)
    *G02F 1/1333*      (2006.01)
    *H01L 51/00*       (2006.01)

(52) U.S. Cl.
    CPC ....... *H05K 5/0017* (2013.01); *H05K 7/20954* (2013.01); *G02F 2001/13332* (2013.01); *G02F 2001/133314* (2013.01); *H01L 51/0097* (2013.01)

(58) Field of Classification Search
    CPC ........... G06F 1/181–1/182; H05K 5/00–5/069; H05K 7/00–7/186; H05K 7/20218–7/20381; H05K 7/20409–7/20418; H05K 7/20009–7/202; H01L 23/367–23/3677; H01L 23/473; H01L 23/46–23/467
    USPC .... 361/679.01–679.45, 679.55–679.61, 756, 361/741, 686, 687, 787, 789, 794, 361/807–810, 676–678, 679.46–679.54, 361/688–727; 348/787, 789, 794; 349/56–60; 455/575.1–575.9; 312/223.1–223.3
    See application file for complete search history.

(56) References Cited

U.S. PATENT DOCUMENTS

| | | | | |
|---|---|---|---|---|
| 2008/0210843 A1* | 9/2008 | Han | ..................... | H05K 5/0213 361/679.01 |
| 2008/0303971 A1 | 12/2008 | Lee et al. | | |
| 2009/0122218 A1* | 5/2009 | Oh | ..................... | G02F 1/133385 361/679.21 |
| 2010/0118226 A1 | 5/2010 | Kim | | |
| 2010/0246104 A1* | 9/2010 | Park | ..................... | H05K 5/02 361/679.01 |
| 2010/0265638 A1* | 10/2010 | Sakamoto | ............. | F16M 11/08 361/679.01 |
| 2010/0302717 A1* | 12/2010 | Oh | ..................... | G02F 1/133308 361/679.01 |
| 2011/0110046 A1* | 5/2011 | Itoh | ..................... | G02F 1/133308 361/709 |
| 2011/0310543 A1* | 12/2011 | Kim | ..................... | G02F 1/133308 361/679.01 |
| 2012/0293960 A1* | 11/2012 | Takashima | ........ | G02F 1/133308 361/707 |
| 2013/0010413 A1* | 1/2013 | Kim | ..................... | G09F 9/33 361/679.01 |
| 2013/0194781 A1* | 8/2013 | Kim | ..................... | H04M 1/0266 362/97.1 |
| 2013/0308252 A1* | 11/2013 | Watanabe | ............ | H05K 5/0017 361/679.01 |
| 2014/0133073 A1* | 5/2014 | Ahn | ..................... | H01L 51/5237 361/679.01 |
| 2014/0184980 A1* | 7/2014 | Onoue | ................. | G02F 1/1336 349/58 |
| 2015/0084490 A1* | 3/2015 | Fujiwara | ................ | G06F 1/203 312/236 |
| 2015/0085471 A1 | 3/2015 | Jeon et al. | | |
| 2015/0163928 A1* | 6/2015 | Cho | ..................... | G02F 1/133608 362/97.1 |
| 2015/0373859 A1* | 12/2015 | Hwang | ................ | H05K 5/0017 362/611 |
| 2016/0021774 A1* | 1/2016 | Ha | ..................... | H05K 7/02 361/679.01 |
| 2016/0026029 A1* | 1/2016 | Kawada | ............. | G02F 1/133308 349/58 |
| 2016/0033996 A1* | 2/2016 | Lee | ..................... | G06F 1/1626 361/679.26 |
| 2016/0044802 A1* | 2/2016 | Kim | ..................... | G02F 1/133308 361/679.01 |
| 2016/0120041 A1* | 4/2016 | Lee | ..................... | G02F 1/133308 361/679.01 |
| 2016/0135305 A1* | 5/2016 | Shin | ..................... | G02F 1/133308 361/694 |
| 2016/0179139 A1* | 6/2016 | Ahn | ..................... | G06F 1/1686 361/679.3 |
| 2016/0192523 A1* | 6/2016 | Lin | ..................... | G02F 1/133308 361/679.01 |

\* cited by examiner

DISPLAY DEVICE

This application claims the benefit of Korean Patent Application Nos. 10-2016-0030467 filed on Mar. 14, 2016, and 10-2015-0149346 filed on Oct. 27, 2015, the entire contents of which are incorporated herein by reference for all purposes as if fully set forth herein.

BACKGROUND OF THE INVENTION

Field of the Invention

The present disclosure relates to a display device having a slim profile and rigidity.

Discussion of the Related Art

With the development of the information society, various demands for display devices have been increasing. Various display devices, such as liquid crystal displays (LCDs), plasma display panels (PDPs), electroluminescent displays (ELDs), vacuum fluorescent displays (VFDs), and organic light emitting diode (OLED) displays, have been recently studied and used to meet various demands for the display devices.

An OLED display panel is formed by depositing an organic material layer capable of emitting light on a substrate, at which transparent electrodes are formed. The OLED display panel is also thin and flexible. Many studies on structural characteristics of display devices including the OLED display panel have been performed.

SUMMARY OF THE INVENTION

In one aspect, there is provided a display device including a display panel, a rear frame in a rear of the display panel, and a front frame positioned between the display panel and the rear frame and coupled with the display panel and the rear frame, the front frame including a plate portion facing the display panel and a side frame formed at a side or an edge of the plate portion, wherein the side frame includes a first side wall adjacent to a side of the display panel and extended from the plate portion, a second side wall located near a side of the first side wall and exposed to outside, a first bending portion extended from the first side wall and connecting the first side wall to an end of the second side wall, and a second bending portion extended from the other end of the second side wall and bent from the second side wall toward the rear frame or the front frame.

In another aspect, there is provided a display device comprising a display panel and a module cover in a rear of the display panel, the module cover including a plate portion positioned corresponding to a back surface of the display panel and forming a plane of the module cover, a side wall extended from the plate portion and positioned adjacent to a side of the display panel, and a reinforcement wall bent toward an inside of the module cover at an end of the side wall and positioned near to the side wall.

Further scope of applicability of the present invention will become apparent from the detailed description given hereinafter. However, the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
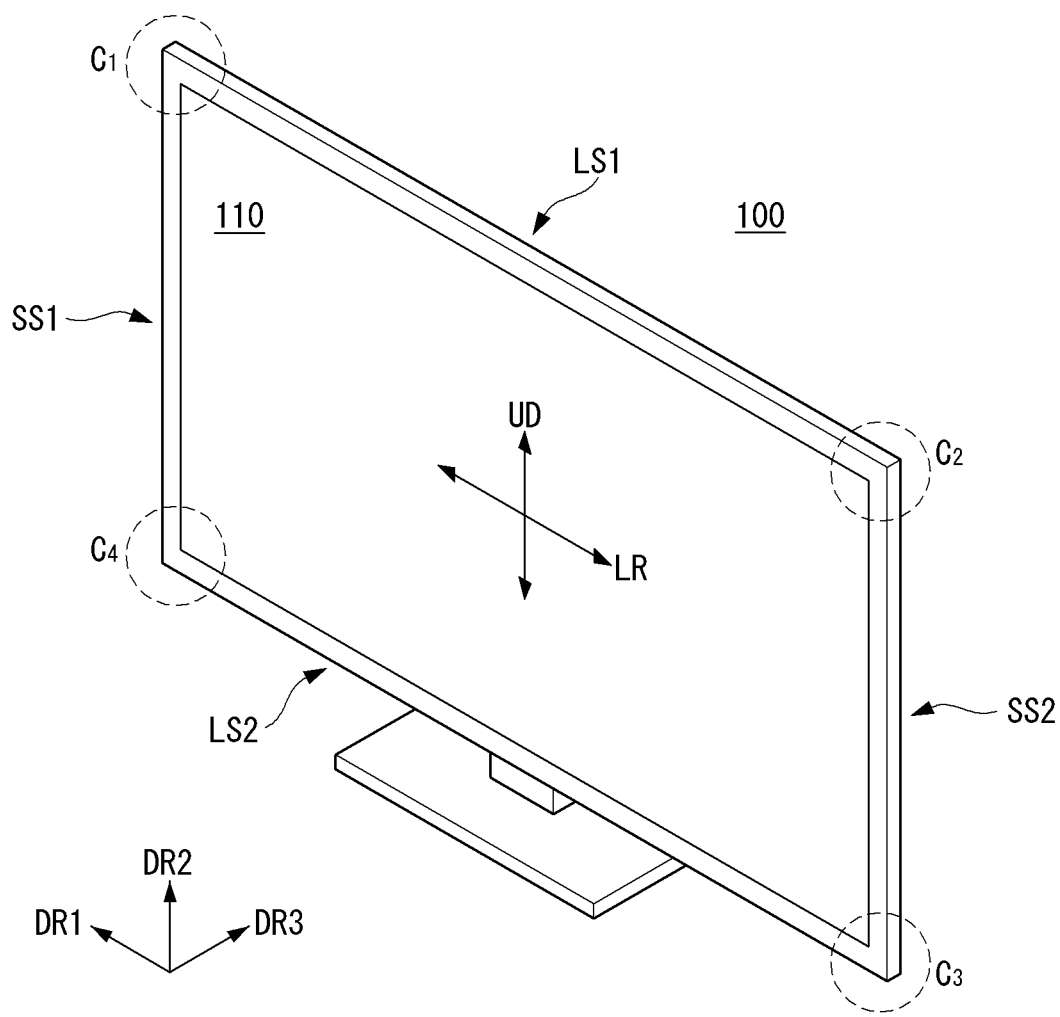
FIGS. 1 to 4 illustrate configuration of a display device according to an embodiment of the invention.

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed. When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context. In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following embodiments of the present invention are provided to those skilled in the art in order to describe the present invention more completely. Accordingly, shapes and sizes of elements shown in the drawings may be exaggerated for clarity.

Hereinafter, an embodiment of the invention is described using an organic light emitting diode (OLED) display panel as an example of a display panel. Other display panels may be used. For example, a plasma display panel (PDP), a field emission display (FED) panel, and a liquid crystal display panel may be used.

In what follows, a display device can include a first long side LS1, a second long side LS2 opposite the first long side LS1, a first short side SS1 adjacent to one end of the first long side LS1 and one end of the second long side LS2, and a second short side SS2 opposite the first short side SS1.

In the embodiment disclosed herein, the first short side SS1 may be referred to as a first side area; the second short side SS2 may be referred to as a second side area opposite the first side area; the first long side LS1 may be referred to as a third side area which is adjacent to the first side area and the second side area and is positioned between the first side area and the second side area; and the second long side LS2 may be referred to as a fourth side area which is adjacent to the first side area and the second side area, is positioned between the first side area and the second side area, and is opposite to the third side area.

The embodiment of the invention describes that lengths of the first and second long sides LS1 and LS2 are longer than lengths of the first and second short sides SS1 and SS2 for the sake of brevity and ease of reading. However, the lengths of the first and second long sides LS1 and LS2 may be almost equal to the lengths of the first and second short sides SS1 and SS2.

In the following description, a first direction DR1 may be a direction parallel to the long sides LS1 and LS2 of the display device, and a second direction DR2 may be a direction parallel to the short sides SS1 and SS2 of the display device. A third direction DR3 may be a direction vertical to the first direction DR1 and/or the second direction DR2.

In the embodiment disclosed herein, the first direction DR1 and the second direction DR2 may be commonly referred to as a horizontal direction. Further, the third direction DR3 may be referred to as a vertical direction. In addition, a side or a surface, on which the display device displays an image, may be referred to as a front side or a front surface. When the display device displays the image, a side or a surface, at which the image cannot be observed, may be referred to as a back side or a back surface. When the display device is observed at the front side or the front surface, the first long side LS1 may be referred to as an upper side or an upper surface. In the same manner as the first long side LS1, the second long side LS2 may be referred to as a lower side or a lower surface. Further, the first short side SS1 may be referred to as a left side or a left surface, and the second short side SS2 may be referred to as a right side or a right surface.

Further, the first long side LS1, the second long side LS2, the first short side SS1, and the second short side SS2 may be referred to as edges of the display device. Positions where the first long side LS1, the second long side LS2, the first short side SS1, and the second short side SS2 meet one another may be referred to as corners. For example, a position where the first long side LS1 and the first short side SS1 meet each other may be referred to as a first corner C1; a position where the first long side LS1 and the second short side SS2 meet each other may be referred to as a second corner C2; a position where the second short side SS2 and the second long side LS2 meet each other may be referred to as a third corner C3; and a position where the second long side LS2 and the first short side SS1 meet each other may be referred to as a fourth corner C4.

In the embodiment disclosed herein, a direction from the first short side SS1 to the second short side SS2 or a direction from the second short side SS2 to the first short side SS1 may be referred to as a left-right direction LR. A direction from the first long side LS1 to the second long side LS2 or from the second long side LS2 to the first long side LS1 may be referred to as an up-down direction UD.

FIGS. 1 to 4 illustrate a display device according to an embodiment of the invention. Referring to FIG. 1, one surface of a display panel 110 may be observed in front of a display device 100. The one surface of the display panel 110 displays an image. The display panel 110 is divided into an active area, on which the image is displayed, and an inactive area, on which the image is not displayed. A bezel is positioned at an edge of a front surface of the display device 100 and can include the inactive area.

Figure 2:
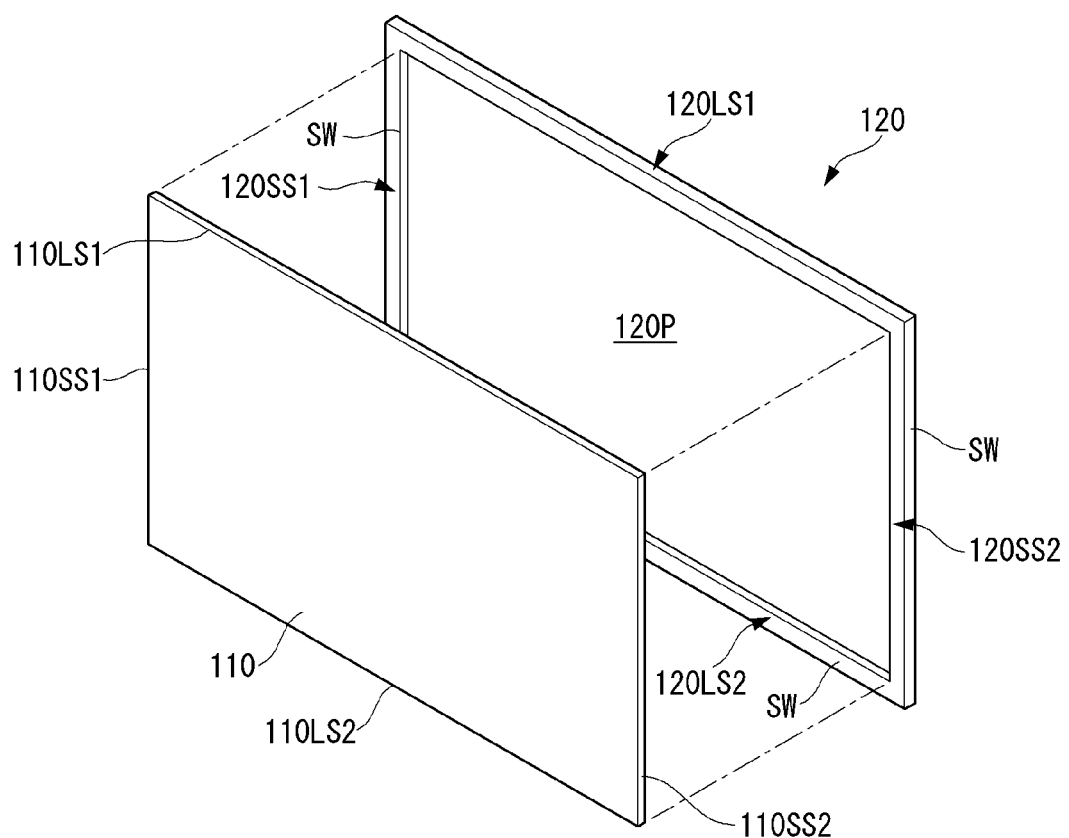

Referring to FIG. 2, a module cover 120 can includes a plate portion 120P and a side wall SW. The module cover 120 supports the display panel 110. Thus, the module cover 120 can be made of a metal material. Further, the module cover 120 may be made of a slim metal or an ultra slim metal. Thus, the plate portion 120P may be made of a metal material and may be made of a slim metal or an ultra slim metal. In addition, the side wall SW can be positioned at an edge of the plate portion 120P. The plate portion 120P and the side wall SW can be formed as one body.

Alternatively, the side wall SW can be formed separately from the plate portion 120P and can be coupled with the plate portion 120P. The side wall SW may have a thickness greater than a thickness of the plate portion 120P, or the same thickness as the plate portion 120P. The module cover 120 can include the plate portion 120P and the side wall SW through the pressing. An area of the plate portion 120P may correspond to an area of the display panel 110. The side wall SW can be positioned on a first long side 120LS1, a second long side 120LS2, a first short side 120SS1, or a second short side 120SS2 of the module cover 120.

The display panel 110 is positioned on a front surface of the plate portion 120P and may be flexible. The display panel 110 positioned on the front surface of the plate portion 120P may be provided with predetermined rigidity by the module cover 120. A length of a first long side 110LS1 of the display panel 110 may be slightly shorter than a length of the first long side 120LS1 of the module cover 120. A length of a first short side 110SS1 of the display panel 110 may be slightly shorter than a length of the first short side 120SS1 of the module cover 120. The display panel 110 may be attached to the plate portion 120P or inserted into the module cover 120. The display panel 110 may be attached to the plate portion 120P or inserted into the plate portion 120P.

The display panel 110 is provided at the front surface of the display device 100 and displays an image. The display panel 110 divides the image into a plurality of pixels and outputs the image while controlling color, brightness, and chroma of each pixel. The display panel 110 is divided into the active area, on which the image is displayed, and the inactive area, on which the image is not displayed. The display panel 110 generates light corresponding to red, green, or blue color in response to a control signal. The rigidity, which is provided for the display panel 110 by the module cover 120, may vary depending on a depth of the module cover 120.

Figure 3:
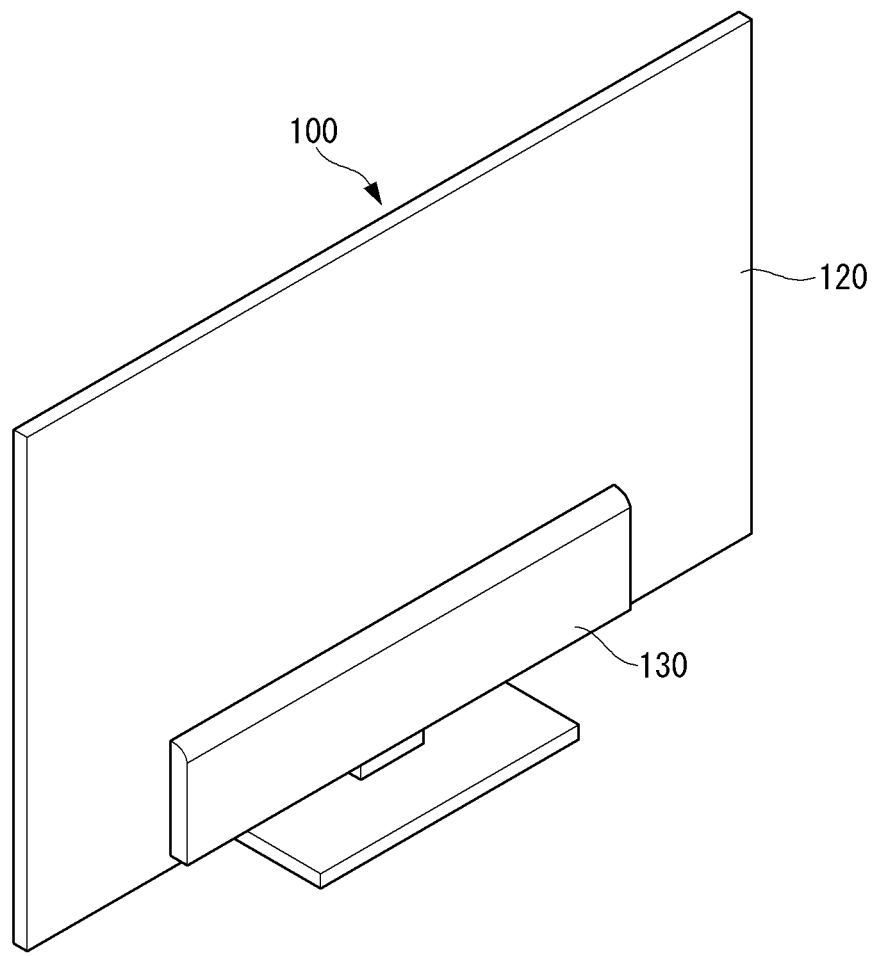

Referring to FIG. 3, the display device 100 can include a back cover 130. The back cover 130 is positioned in the rear of the display device 100. The back cover 130 can be positioned in a portion of the rear of the module cover 120 and cover most of a back surface of the module cover 120. The back cover 130 can be formed of a synthetic resin. For example, the back cover 130 can be positioned on a lower part of the back surface of the module cover 120. When the back cover 130 is positioned in a portion of the rear of the module cover 120, the back cover 130 may not affect a total thickness of the display device 100. Namely, a thickness of the display device 100 except the back cover 130 may be regarded as the total thickness of the display device 100.

Figure 4:
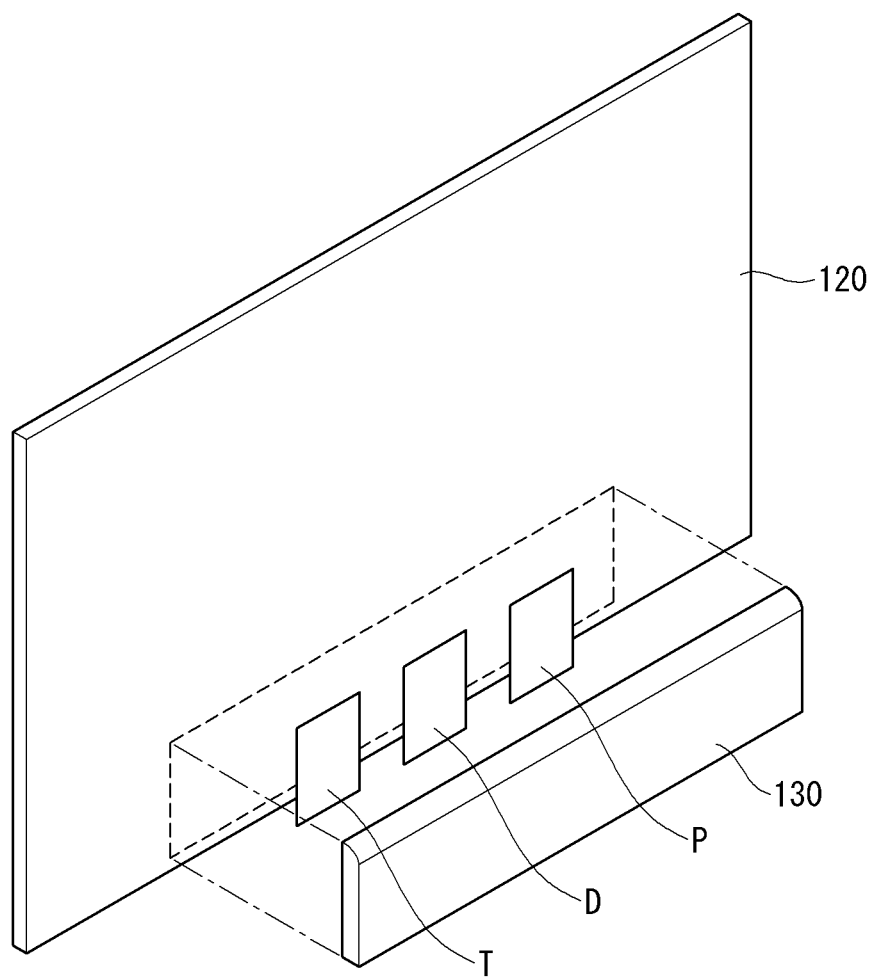

Referring to FIG. 4, the display device 100 can include a power supply unit P, a driver D, and a tuner T. The power supply unit P supplies electric power to the display device 100. The driver D controls an image display operation of the display panel 110 included in the display device 100. The tuner T receives broadcast information or external input information and provide it for the driver D. The back cover 130 can cover the power supply unit P, the driver D, and the tuner T.

Figure 5:
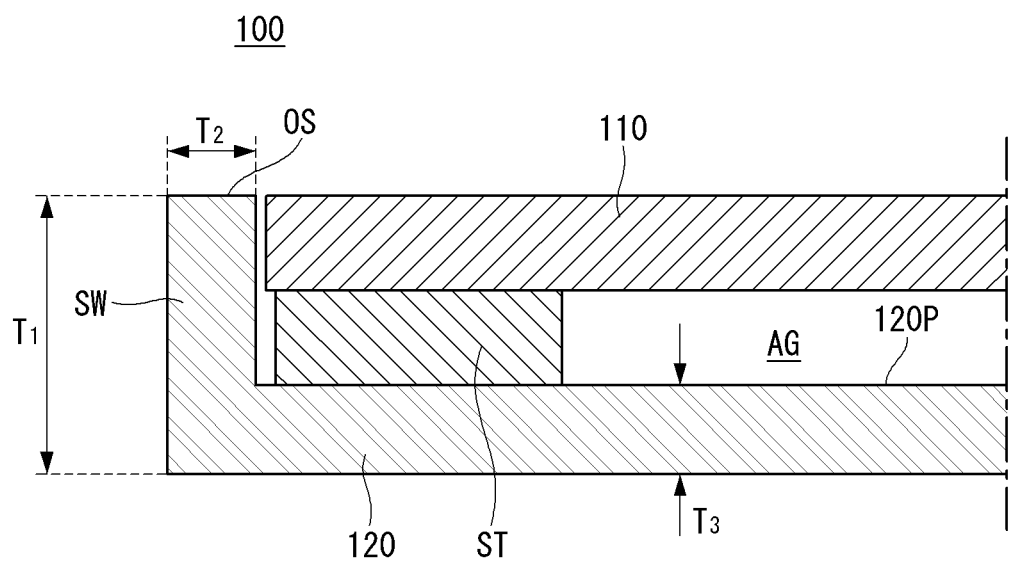
FIGS. 5 to 25 illustrate examples of a display device according to an embodiment of the invention.

FIGS. 5 to 25 illustrate examples of a display device according to an embodiment of the invention. Referring to FIG. 5, the side wall SW can be positioned at one end of the plate portion 120P. The one end of the plate portion 120P may be an edge of the plate portion 120P. The side wall SW can form a wall at one end of the plate portion 120P. The side wall SW may have a predetermined thickness T2. The plate portion 120P and the side wall SW can be formed as one body. The plate portion 120P and the side wall SW can be formed through a press process. In this instance, a height T1 of the side wall SW may be regarded as the total thickness of the display device 100. For example, T1 may be about 4.8 mm, and T2 and T3 may be about 1.8 mm.

In order to secure the rigidity required in the display device 100 while making the total thickness T1 of the display device 100 slim, the thickness T3 of the plate portion 120P, the thickness T2 of the side wall SW, and the height T1 of the side wall SW may be related to one another. For example, when the total thickness T1 of the display device 100 decreases, the thickness T3 of the plate portion 120P or the thickness T2 of the side wall SW decreases. Further, when the thickness T3 of the plate portion 120P or the thickness T2 of the side wall SW decreases, the rigidity required in the display device 100 may be reduced. Thus, because making the total thickness T1 of the display device 100 slim may lead to a reduction in the rigidity required in the display device 100, the structural rigidity of the display device 100 needs to be sufficiently considered.

The display panel 110 can be positioned in front of the module cover 120. The display panel 110 can be positioned on a front surface of the module cover 120. The display panel 110 may be placed on the front surface of the module cover 120. In this instance, the display panel 110 may be inserted into the module cover 120 or attached to the module cover 120 and fixed to the module cover 120. The display panel 110 can be coupled with the module cover 120 by an adhesive member ST. The adhesive member ST may be, for example, a double-sided tape or a synthetic resin.

A space AG can be formed between the display panel 110 and the module cover 120. The space AG may be used to improve heat dissipation ability of the display panel 110. Namely, heat that may be generated in the display panel 110, can be diffused into the entire area of the display device 100 through the space AG.

Figure 6:
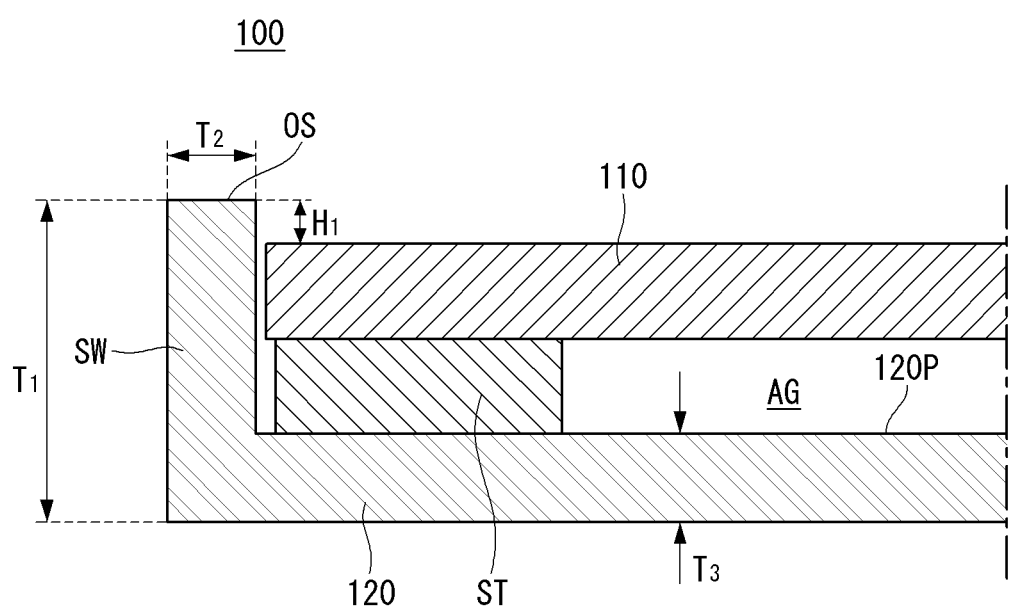

Referring to FIG. 6, one end of the side wall SW can protrude beyond the front surface of the display panel 110 toward the front of the display device 100 by H1. Namely, a height T1 of the side wall SW may be greater than a sum of a thickness of the display panel 110, a thickness of the adhesive member ST, and a thickness T3 of the plate portion 120P. Hence, a damage of the front surface or the side of the display panel 110 can be prevented.

Referring to FIGS. 5 and 6, one surface of the side wall SW forming a portion of the front surface of the display device 100 may be a cutting surface OS of a material forming the module cover 120. When the module cover 120 is made of a metal material, the cutting surface OS is exposed to the outside and oxidized. Namely, the cutting surface OS may be rusted. Hence, a subsequent process for the cutting surface OS may be necessary. For example, the cutting surface OS can be covered with a synthetic resin for oxidation prevention. The cutting surface OS may lead to an increase in the number of manufacturing processes of the display device 100 or an increase in the manufacturing cost of the display device 100.

Figure 7:
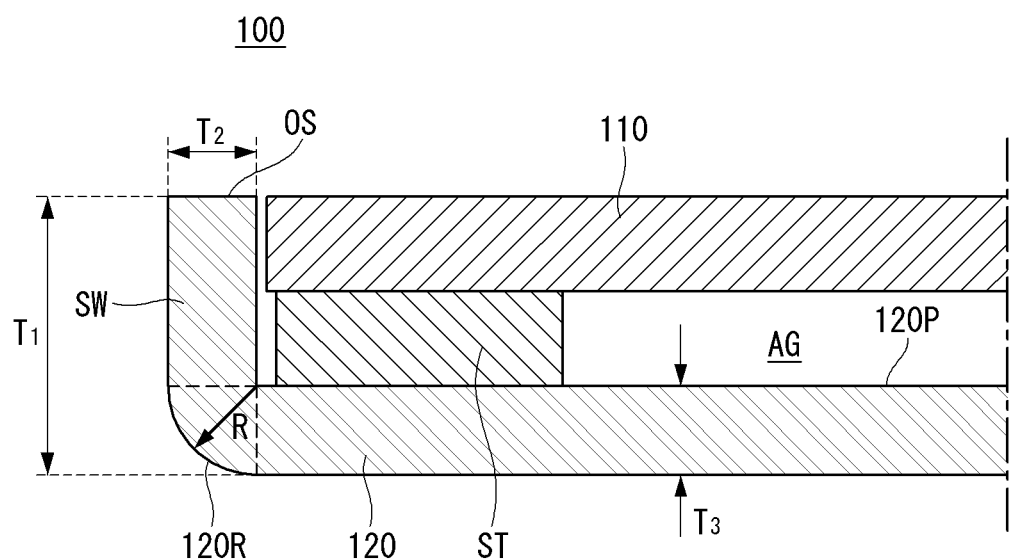
Figure 8:
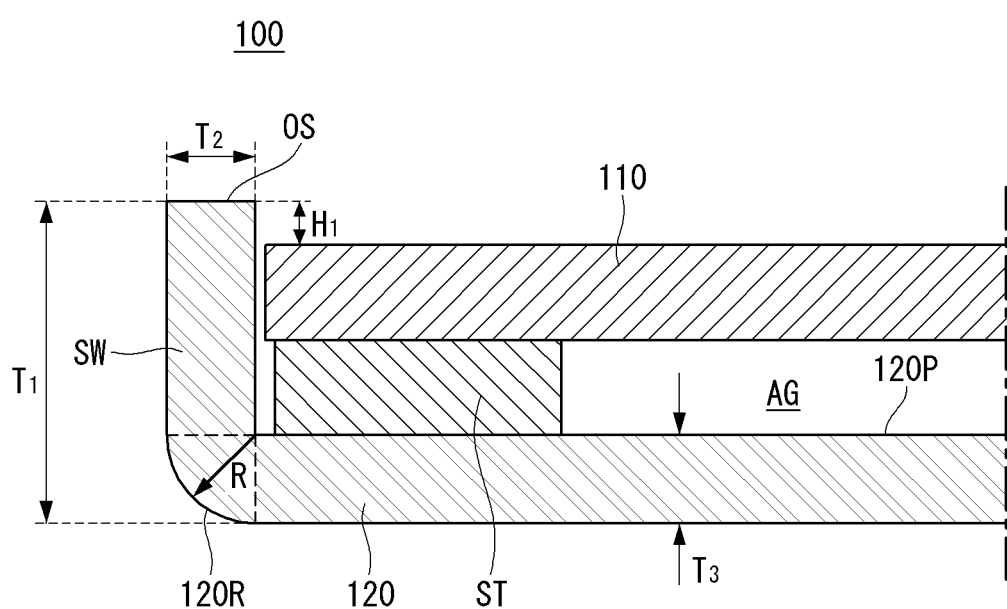

Referring to FIGS. 7 and 8, the module cover 120 can include a curved portion 120R. The curved portion 120R can be formed by rounding a portion of the back surface or a portion of the side of the module cover 120. Namely, an edge of the back surface or the side of the module cover 120 can be rounded. The curved portion 120R can be formed at an edge of the side wall SW and an edge of the plate portion 120P and thus can be formed at both the side wall SW and the plate portion 120P. The curved portion 120R prevents an object or a human body from being damaged by the sharp edge of the display device 100.

Figure 9:
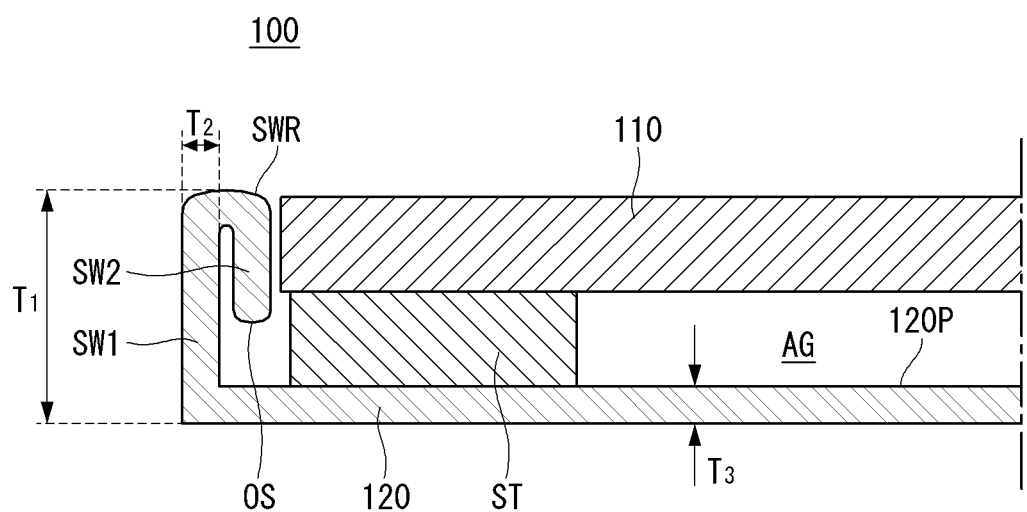

Referring to FIG. 9, the plate portion 120P may have a slimmer thickness. The side wall SW may have a slimmer thickness T2. Further, the side wall SW can include a first side wall SW1 and a second side wall SW2. A height T1 of the first side wall SW1 can form the entire thickness of the display device 100, and the second side wall SW2 can be positioned on one side of the first side wall SW1. The second side wall SW2 can be positioned beside the first side wall SW1 side by side with the first side wall SW1. In this instance, a position of the second side wall SW2 may be a direction toward the inside of the display device 100. The second side wall SW2 may be separated from, may be adjacent to, or may adjoin to the first side wall SW1. The second side wall SW2 may be referred to as a reinforcement wall.

The first side wall SW1 and the second side wall SW2 can be formed as one body. For example, when the first side wall SW1 is formed of a metal material, the second side wall SW2 can be extended from the first side wall SW1 while bending. In this instance, a cutting surface OS may face toward the inside of the display device 100. The cutting surface OS facing toward the inside of the display device 100 corresponds to the cutting surface OS facing toward the inside of the module cover 120. Namely, the cutting surface OS faces the plate portion 120P. Hence, a subsequent process for the cutting surface OS can be omitted. As a result, the number of manufacturing processes of the display device 100 or the manufacturing cost of the display device 100 decreases.

Further, the side wall SW may have a bending surface SWR. The bending surface SWR can be formed by extending the second side wall SW2 from the first side wall SW1 while bending the second side wall SW2. In this instance, the bending surface SWR can face toward the front of the display device 100. Namely, the bending surface SWR can be exposed to the outside of the display device 100. In this instance, when the module cover 120 is made of a metal material, the bending surface SWR may be in a state where antioxidation processing has been already performed on the module cover 120.

As the side wall SW includes the first side wall SW1 and the second side wall SW2, the rigidity of the side wall SW can be improved. In other words, the rigidity of the side wall SW can be maintained or improved even if the entire thickness T1 of the display device 100 decreases. Namely, the module cover 120 having the above-described configuration can have the larger rigidity compared to when the module cover 120 includes only a single plate. For example, T1 may be about 4.6 mm, and T2 or T3 may be about 0.6 mm.

Figure 10:
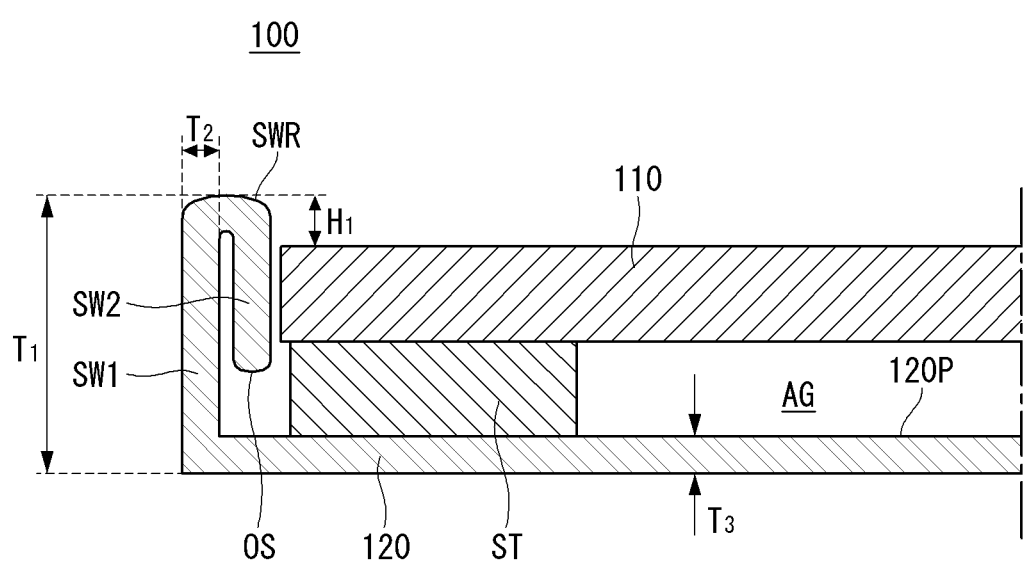

Referring to FIG. 10, one end of the side wall SW can protrude beyond the front surface of the display panel 110 toward the front of the display device 100 by H1. Namely, a height T1 of the side wall SW can be greater than a sum of a thickness of the display panel 110, a thickness of the adhesive member ST, and a thickness T3 of the plate portion 120P. Hence, a damage of the front surface or the side of the display panel 110 can be prevented.

Figure 11:
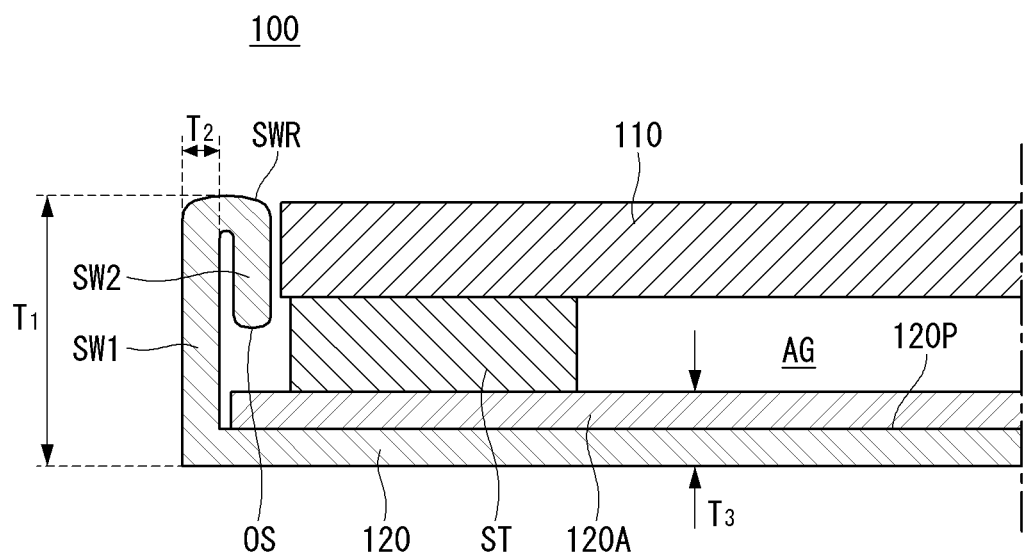

Referring to FIG. 11, the display device 100 can include a reinforcement plate 120A. The reinforcement plate 120A can be positioned inside the module cover 120. The reinforcement plate 120A can be positioned in the rear of the display panel 110. The reinforcement plate 120A can be positioned between the display panel 110 and the module cover 120. The reinforcement plate 120A can be positioned on the front surface of the plate portion 120P and attached to the plate portion 120P. In addition, the reinforcement plate 120A can be positioned between the adhesive member ST and the module cover 120. Namely, the reinforcement plate 120A can be attached to the front surface of the plate portion 120P, the adhesive member ST can be fixed to a portion of a front surface of the reinforcement plate 120A, and the display panel 110 can be fixed to the module cover 120 by the adhesive member ST. In this instance, the reinforcement plate 120A can be coupled with or fixed to the plate portion 120P using an adhesive. For example, T1 may be about 4.6 mm, T2 may be about 0.6 mm, a thickness of the reinforcement plate 120A may be about 0.5 mm to 0.6 mm, a thickness of the plate portion 120P may be about 0.6 mm, and T3 may be about 1.1 mm to 1.2 mm.

Hence, the embodiment of the invention can improve the entire rigidity of the module cover 120 while slimly maintaining the entire thickness of the display device 100.

Figure 12:
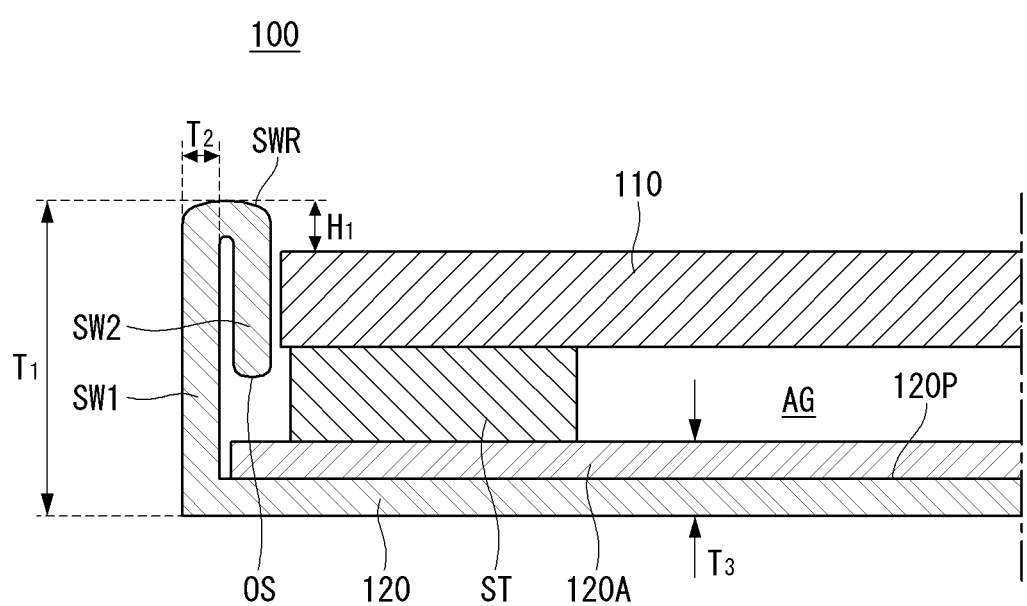

Referring to FIG. 12, one end of the side wall SW can protrude beyond the front surface of the display panel 110 toward the front of the display device 100 by H1. Namely, a height T1 of the side wall SW can be greater than a sum of a thickness of the display panel 110, a thickness of the adhesive member ST, and a thickness T3. Hence, a damage of the front surface or the side of the display panel 110 can be prevented.

Figure 13:
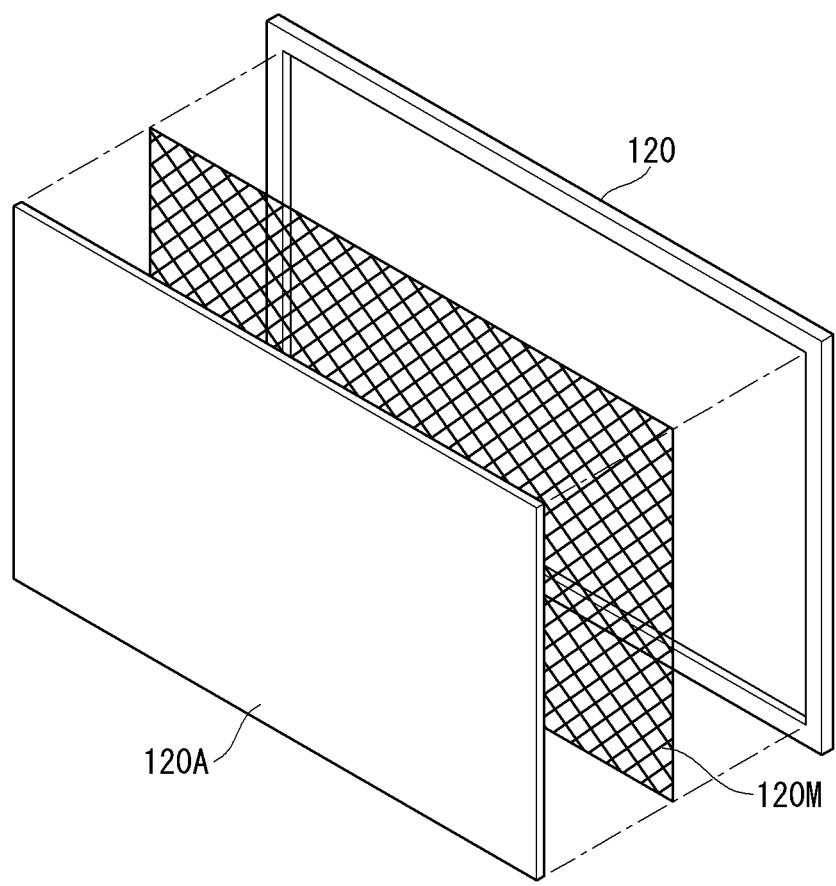

Referring to FIG. 13, the display device 100 can include an adhesive plate 120M. The adhesive plate 120M can be positioned between the module cover 120 and the reinforcement plate 120A. The adhesive plate 120M can be formed in a mesh shape. The adhesive plate 120M can improve a coupling strength or an adhesive strength between the module cover 120 and the reinforcement plate 120A as well as structural rigidity of the module cover 120.

Further, the reinforcement plate 120A may be a first reinforcement plate, and the adhesive plate 120M may be a second reinforcement plate. Furthermore, the reinforcement plate 120A may be a first plate, and the adhesive plate 120M may be a second plate.

Figure 14:
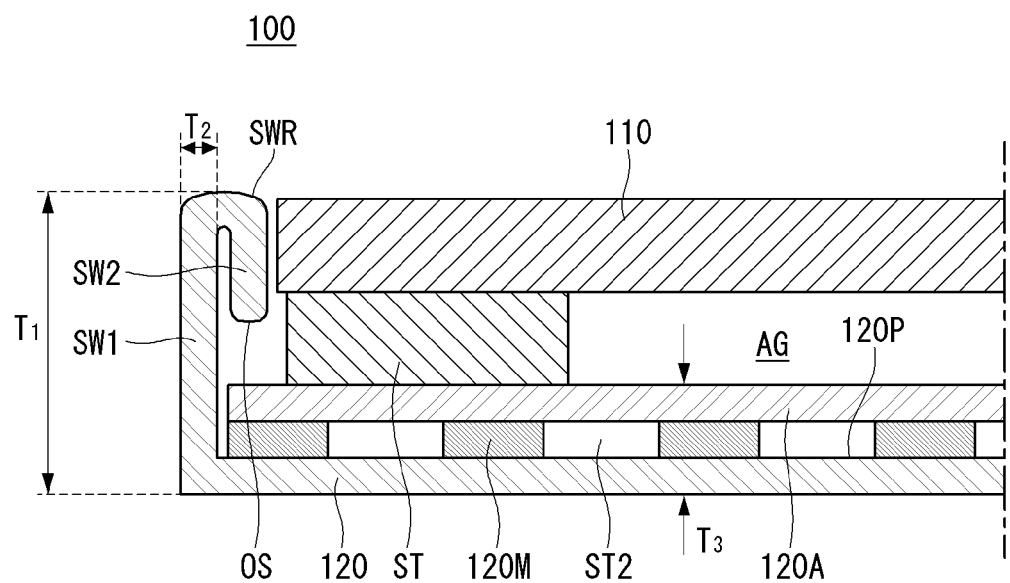

Referring to FIG. 14, an adhesive plate 120M can be positioned between the module cover 120 and the reinforcement plate 120A. The adhesive plate 120M can be coupled with or attached to one surface of the module cover 120, and the reinforcement plate 120A can be coupled with or attached to one surface of the adhesive plate 120M. Namely, the adhesive plate 120M strongly couples the reinforcement plate 120A with the module cover 120. An adhesive ST2 can be formed between the plate portion 120P and the reinforcement plate 120A and can be positioned in an empty space of the adhesive plate 120M.

For example, an adhesive can be applied to the plate portion 120P, the adhesive plate 120M can be placed on the plate portion 120P, and the reinforcement plate 120A can be placed on the adhesive plate 120M. In this instance, the adhesive may be naturally applied to an empty space of the adhesive plate 120M. Hence, a coupling strength or an adhesive strength of the plate portion 120P, the reinforcement plate 120A, and the adhesive plate 120M is further improved. Further, the rigidity of the module cover 120 is further improved. The rigidity of the module cover 120 can include twist rigidity as well as bending rigidity.

Figure 15:
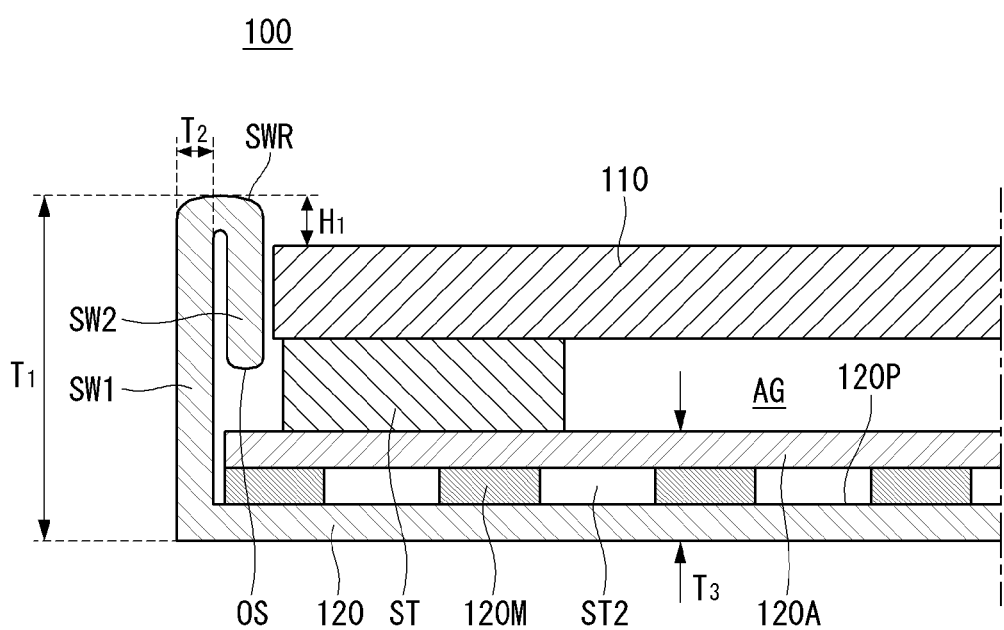

Referring to FIG. 15, one end of the side wall SW can protrude beyond the front surface of the display panel 110 toward the front of the display device 100 by H1. Namely, a height T1 of the side wall SW may be greater than a sum of a thickness of the display panel 110, a thickness of the adhesive member ST, and a thickness T3. Hence, a damage of the front surface or the side of the display panel 110 may be prevented.

Figure 16:
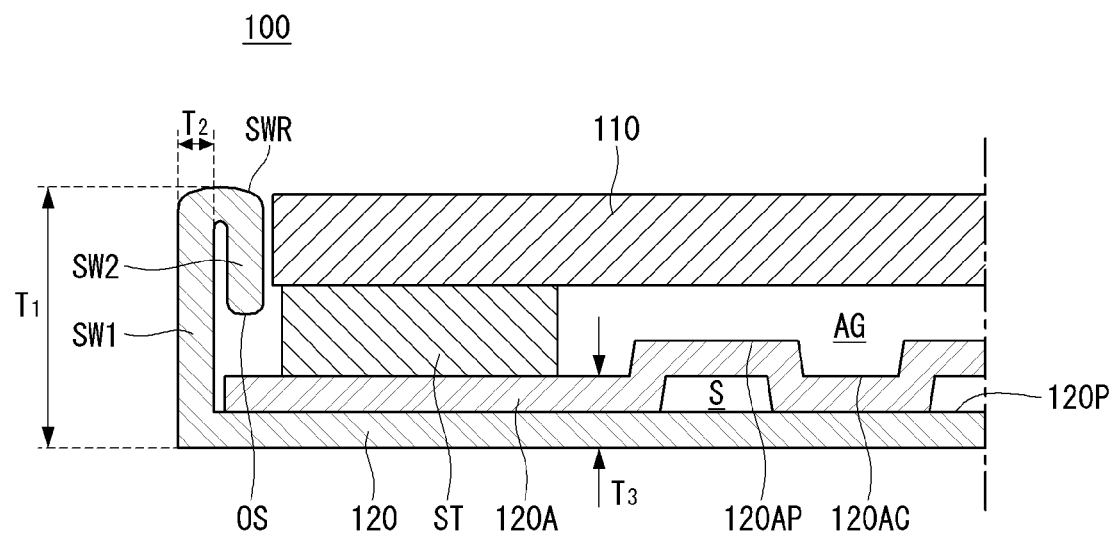

Referring to FIG. 16, the reinforcement plate 120A may be bendingly formed. The reinforcement plate 120A can include uneven portions 120AP and 120AC. The uneven portions 120AP and 120AC can be extended in an up-down direction UD of the reinforcement plate 120A or the display device 100. The uneven portions 120AP and 120AC can be extended in a left-right direction LR of the reinforcement plate 120A or the display device 100. Hence, the reinforcement plate 120A can have the higher rigidity while maintaining a predetermined thickness.

Further, the reinforcement plate 120A can be separated from the plate portion 120P by a predetermined distance due to the uneven portions 120AP and 120AC, thereby forming a space S. When the reinforcement plate 120A is coupled with the plate portion 120P using an adhesive, a large amount of adhesive can be applied to the space S. Hence, an adhesive strength between the plate portion 120P and the reinforcement plate 120A can be improved. The reinforcement plate 120A including the uneven portions 120AP and 120AC can provide the higher rigidity for a large screen display device.

Figure 17:
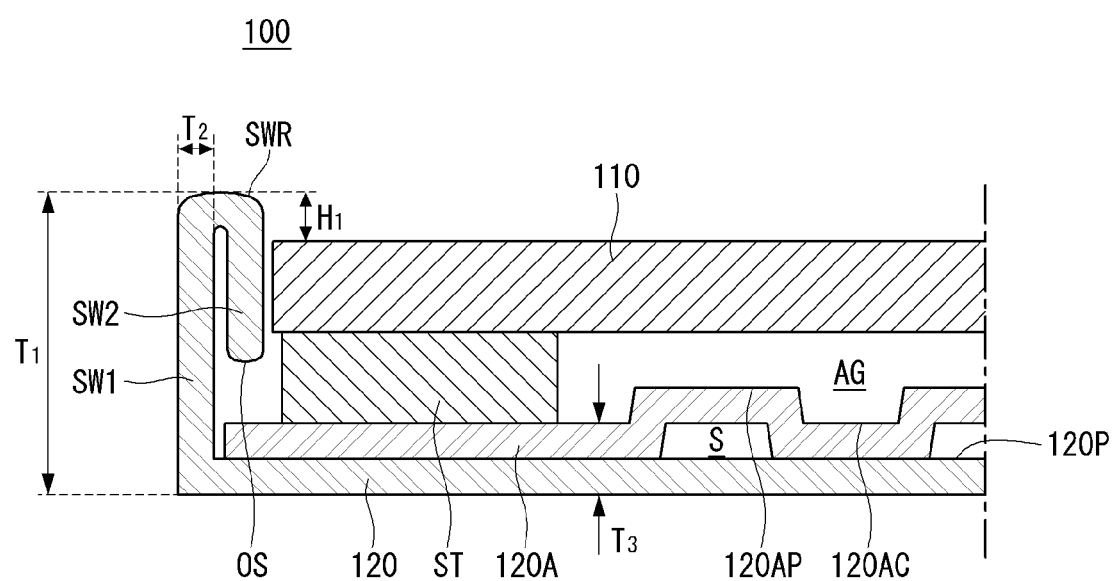

Referring to FIG. 17, one end of the side wall SW can protrude beyond the front surface of the display panel 110 toward the front of the display device 100 by H1. Namely, a height T1 of the side wall SW may be greater than a sum of a thickness of the display panel 110, a thickness of the adhesive member ST, and a thickness T3. Hence, a damage of the front surface or the side of the display panel 110 may be prevented.

Figure 18A:
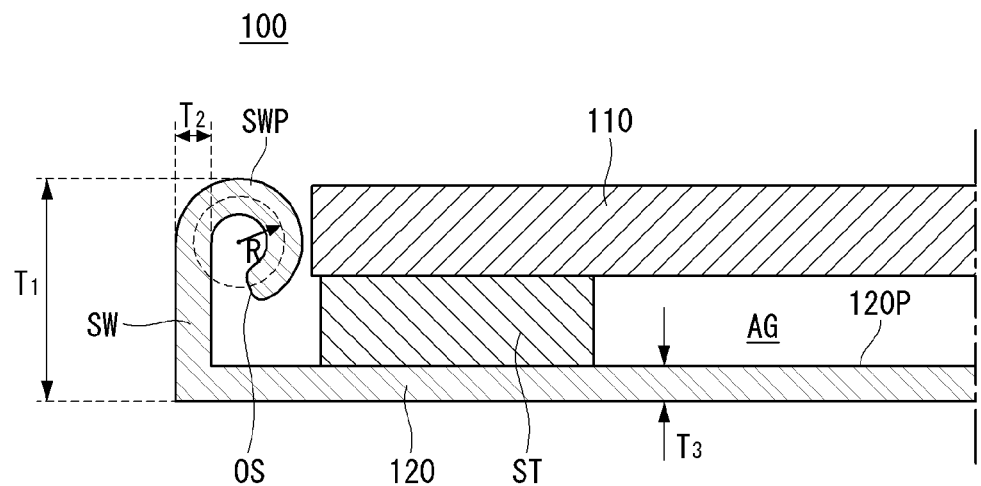

Referring to FIG. 18A, the display device 100 can include a pipe SWP. In particular, the module cover 120 can include the pipe SWP. The pipe SWP can be positioned at one end of the side wall SW. The pipe SWP can be positioned inside the side wall SW. The pipe SWP and the side wall SW may also be formed as one body. Alternatively, the pipe SWP and the side wall SW can be formed separately and coupled with each other. As shown, the pipe SWP may have a closed shape forming a circle R, or may have an open shape not forming a circle R. Hence, the bending rigidity of the side wall SW of the module cover 120 can be improved. Further, the twist rigidity of the side wall SW of the module cover 120 can be improved. The pipe SWP may be referred to as a reinforcement wall. Further, the side wall SW may be referred to as the first side wall, and the pipe SWP may be referred to as the second side wall.

In addition, the first side wall SW and the second side wall SWP can be formed as one body. For example, when the first side wall SW is formed of a metal material, the second side wall SWP can be extended from the first side wall SW and bent while being wound toward the inside of the module cover 120. In this instance, a cutting surface OS can face toward the inside of the display device 100. The fact that the cutting surface OS faces toward the inside of the display device 100 corresponds to the cutting surface OS facing toward the inside of the module cover 120. Namely, the cutting surface OS can face the plate portion 120P or the first side wall SW. Hence, a subsequent process for the cutting surface OS can be omitted. As a result, the number of manufacturing processes of the display device 100 or the manufacturing cost of the display device 100 decreases.

In this instance, when the module cover 120 is formed of a metal material, the second side wall SWP may be in a state where antioxidation processing has been already performed on the module cover 120. Thus, subsequent antioxidation processing may be unnecessary for the second side wall SWP exposed to the inside of the display device 100. As a result, the number of manufacturing processes of the display device 100 or the manufacturing cost of the display device 100 decreases.

Figure 18B:
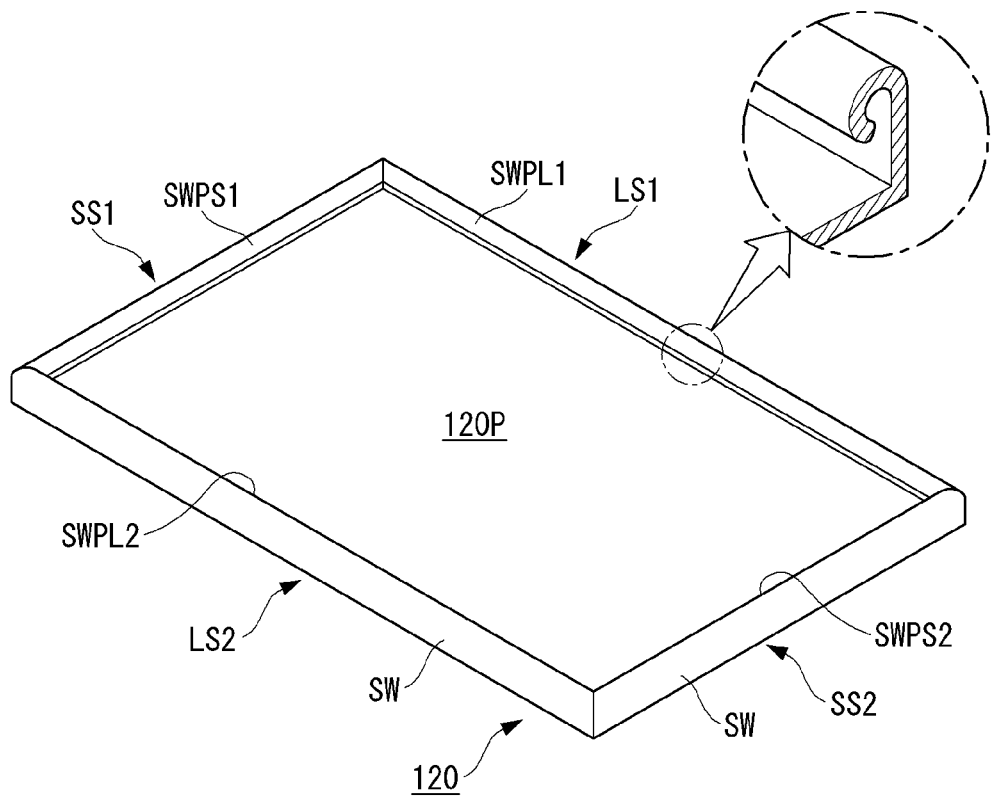

Referring to FIG. 18B, the pipe SWP can be positioned on all of four sides of the module cover 120. For example, a first long pipe SWPL1 can be positioned on the first long side LS1, a second long pipe SWPL2 can be positioned on the second long side LS2, a first short pipe SWPS1 can be positioned on the first short side SS1, and a second short pipe SWPS2 can be positioned on the second short side SS2. Hence, the bending rigidity or the twist rigidity of the module cover 120 may be entirely improved.

Figure 19:
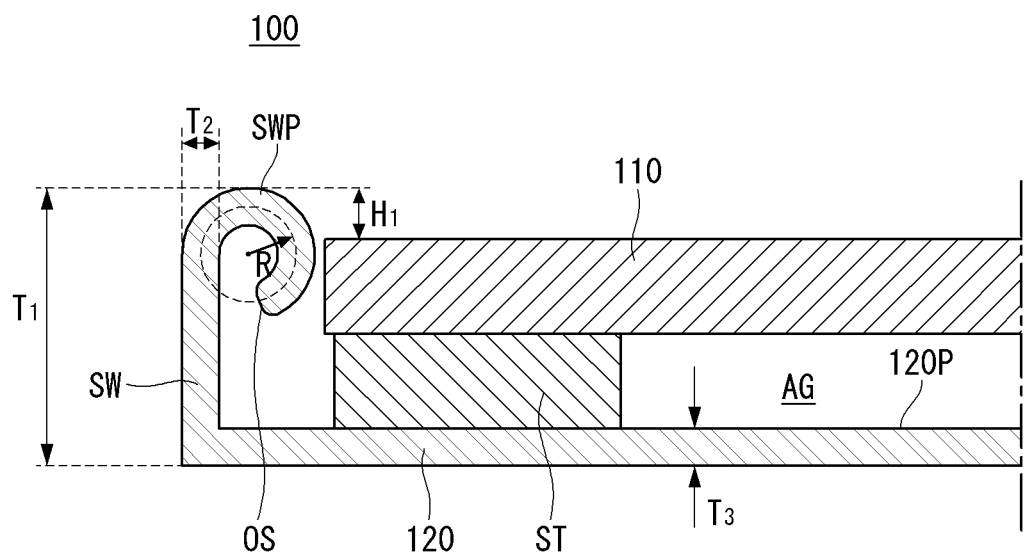

Referring to FIG. 19, one end of the side wall SW can protrude beyond the front surface of the display panel 110 toward the front of the display device 100 by H1. Namely, a height T1 of the side wall SW may be greater than a sum of a thickness of the display panel 110, a thickness of the adhesive member ST, and a thickness T3 of the plate portion 120P. Hence, a damage of the front surface or the side of the display panel 110 can be prevented.

Figure 20:
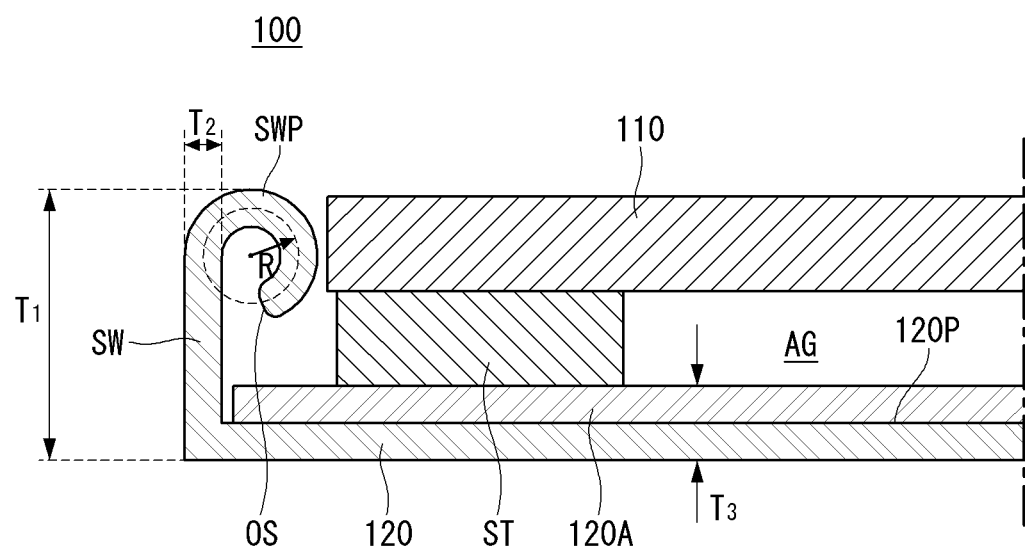

Referring to FIG. 20, the display device 100 can include a reinforcement plate 120A. The reinforcement plate 120A can be positioned inside the module cover 120. The reinforcement plate 120A can be positioned in the rear of the display panel 110. The reinforcement plate 120A can be positioned between the display panel 110 and the module cover 120. The reinforcement plate 120A can be positioned on the front surface of the plate portion 120P and attached to the plate portion 120P.

Further, the reinforcement plate 120A can be positioned between the adhesive member ST and the module cover 120. Namely, the reinforcement plate 120A may be attached to the front surface of the plate portion 120P, the adhesive member ST may be fixed to a portion of a front surface of the reinforcement plate 120A, and the display panel 110 may be fixed to the module cover 120 by the adhesive member ST.

In this instance, the reinforcement plate 120A can be coupled with or fixed to the plate portion 120P using an adhesive. For example, T1 may be about 4.6 mm, T2 may be about 0.6 mm, a thickness of the reinforcement plate 120A may be about 0.5 mm to 0.6 mm, a thickness of the plate portion 120P may be about 0.6 mm, and T3 may be about 1.1 mm to 1.2 mm. Hence, the embodiment of the invention can improve the entire rigidity of the module cover 120 while slimly maintaining the entire thickness of the display device 100.

Figure 21:
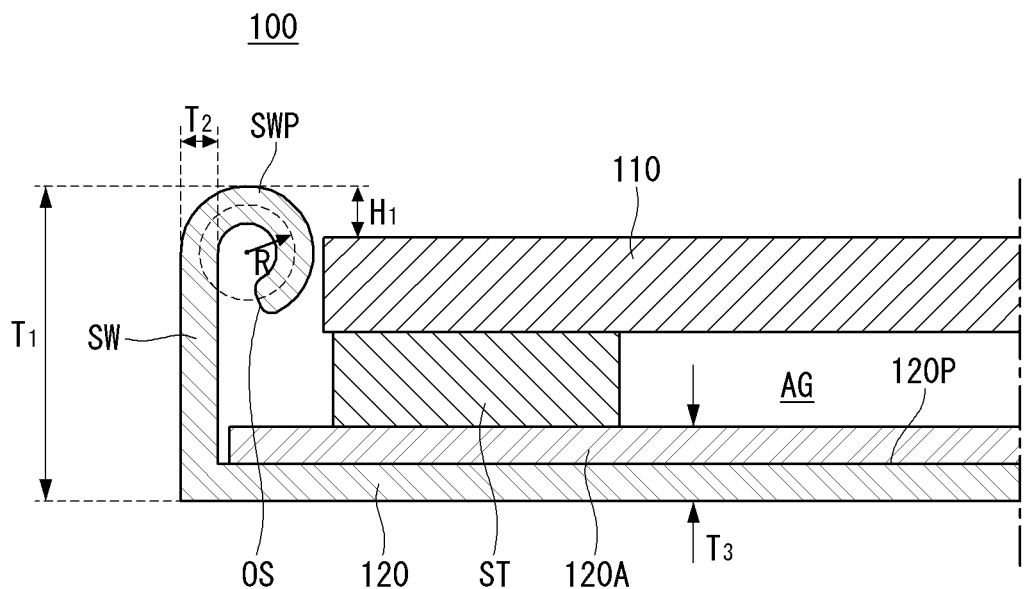

Referring to FIG. 21, one end of the side wall SW can protrude beyond the front surface of the display panel 110 toward the front of the display device 100 by H1. Namely, a height T1 of the side wall SW may be greater than a sum of a thickness of the display panel 110, a thickness of the adhesive member ST, and a thickness T3. Hence, a damage of the front surface or the side of the display panel 110 may be prevented.

Figure 22:
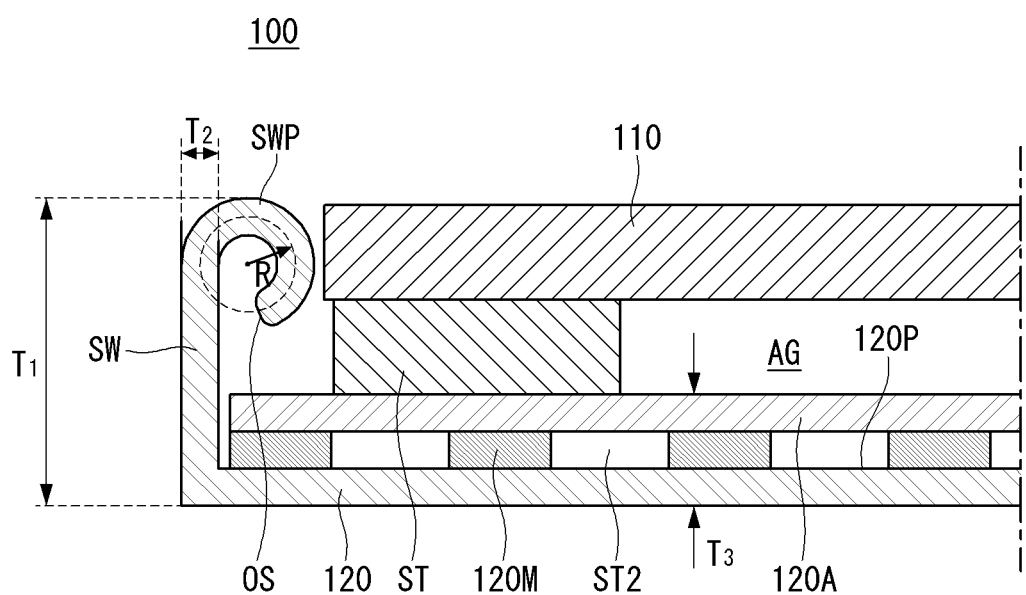

Referring to FIG. 22, an adhesive plate 120M can be positioned between the module cover 120 and the reinforcement plate 120A. The adhesive plate 120M can be coupled with or attached to one surface of the module cover 120, and the reinforcement plate 120A can be coupled with or attached to one surface of the adhesive plate 120M. Namely, the adhesive plate 120M strongly couples the reinforcement plate 120A with the module cover 120. An adhesive ST2 can be formed between the plate portion 120P and the reinforcement plate 120A. The adhesive ST2 can be positioned in an empty space of the adhesive plate 120M.

For example, an adhesive can be applied to the plate portion 120P, the adhesive plate 120M can be placed on the plate portion 120P, and the reinforcement plate 120A can be placed on the adhesive plate 120M. In this instance, the adhesive may be naturally applied to an empty space of the adhesive plate 120M. Hence, a coupling strength or an adhesive strength of the plate portion 120P, the reinforcement plate 120A, and the adhesive plate 120M is further improved. Further, the rigidity of the module cover 120 is further improved. The rigidity of the module cover 120 can include a twist rigidity as well as a bending rigidity. Hence, the embodiment of the invention can improve the entire rigidity of the module cover 120 while slimly maintaining the entire thickness of the display device 100.

Figure 23:
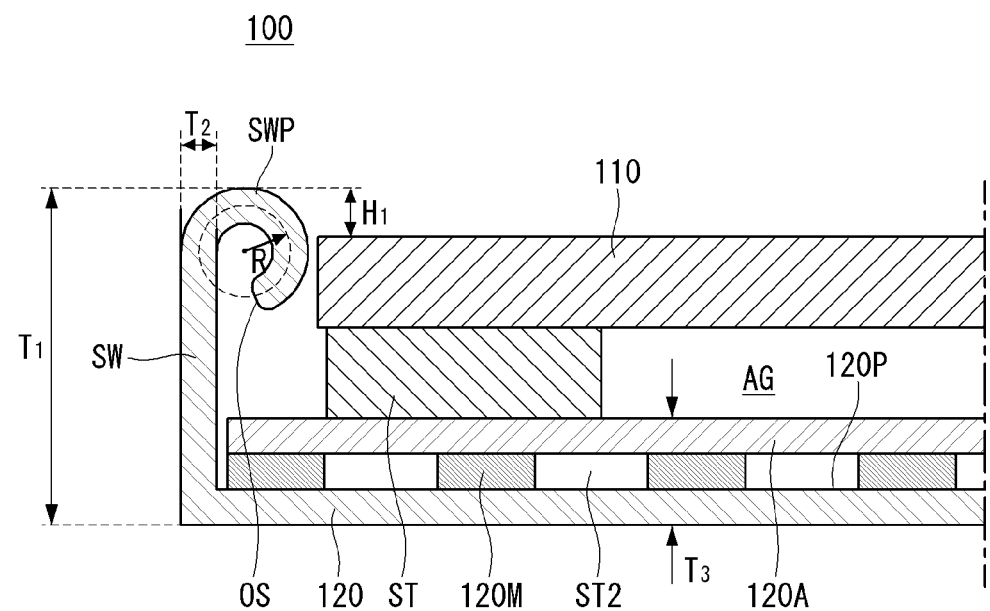

Referring to FIG. 23, one end of the side wall SW can protrude beyond the front surface of the display panel 110 toward the front of the display device 100 by H1. Namely, a height T1 of the side wall SW may be greater than a sum of a thickness of the display panel 110, a thickness of the adhesive member ST, and a thickness T3. Hence, a damage of the front surface or the side of the display panel 110 may be prevented.

Figure 24:
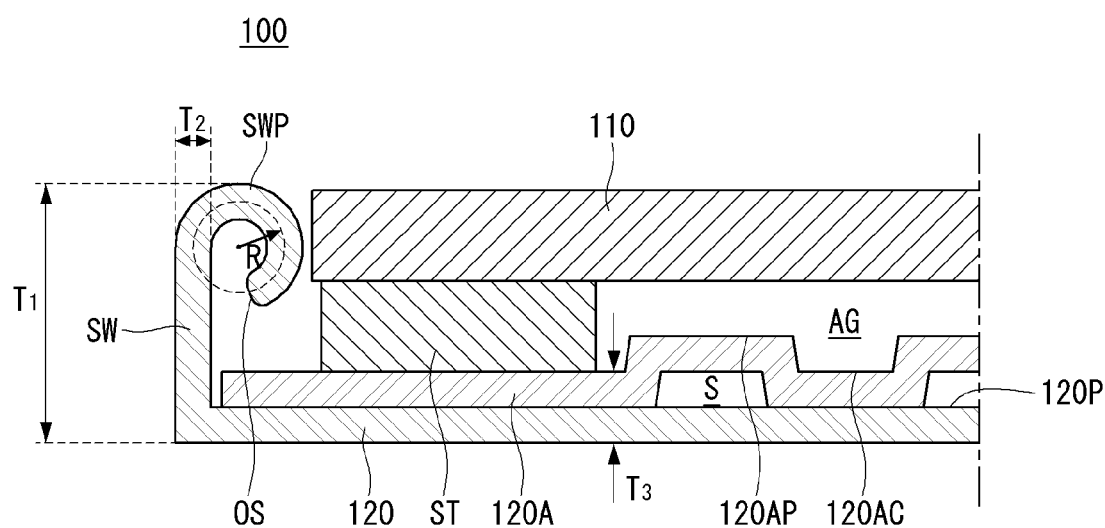

Referring to FIG. 24, the reinforcement plate 120A may be bendingly formed. The reinforcement plate 120A can include uneven portions 120AP and 120AC. The uneven portions 120AP and 120AC can be extended in an up-down direction UD of the reinforcement plate 120A or the display device 100. The uneven portions 120AP and 120AC can be extended in a left-right direction LR of the reinforcement plate 120A or the display device 100. Hence, the reinforcement plate 120A can have the higher rigidity while maintaining a predetermined thickness.

The reinforcement plate 120A may be separated from the plate portion 120P by a predetermined distance due to the uneven portions 120AP and 120AC, thereby forming a space S. When the reinforcement plate 120A is coupled with the plate portion 120P using an adhesive, a large amount of adhesive can be applied to the space S. Hence, an adhesive strength between the plate portion 120P and the reinforcement plate 120A can be improved. The reinforcement plate 120A including the uneven portions 120AP and 120AC can provide the higher rigidity for a large screen display device. Hence, the embodiment of the invention can improve the entire rigidity of the module cover 120 while slimly maintaining the entire thickness of the display device 100.

Figure 25:
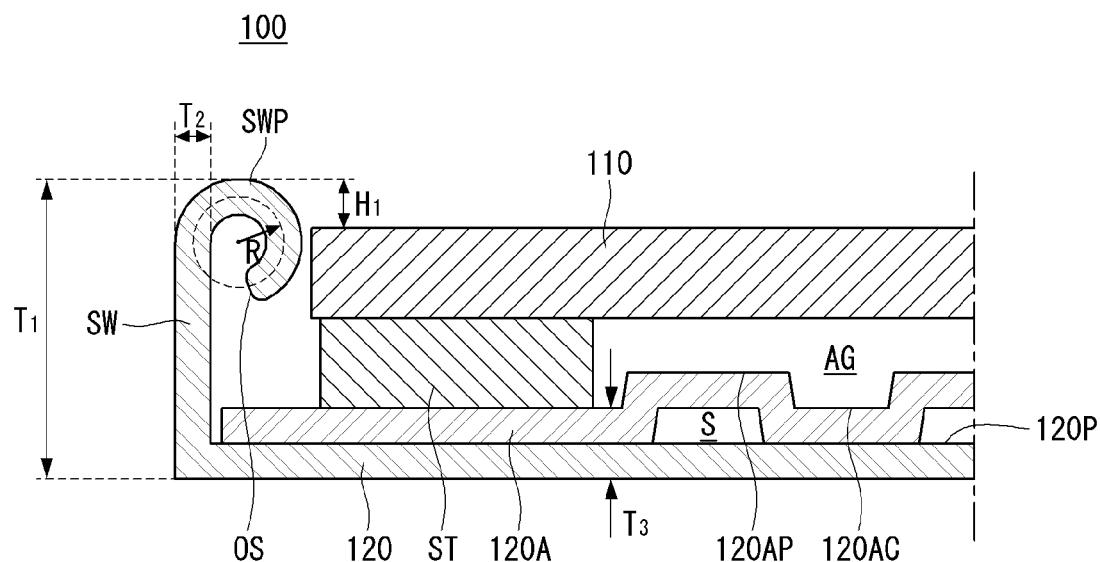

Referring to FIG. 25, one end of the side wall SW can protrude beyond the front surface of the display panel 110 toward the front of the display device 100 by H1. Namely, a height T1 of the side wall SW may be greater than a sum of a thickness of the display panel 110, a thickness of the adhesive member ST, and a thickness T3. Hence, a damage of the front surface or the side of the display panel 110 may be prevented.

Figure 26:
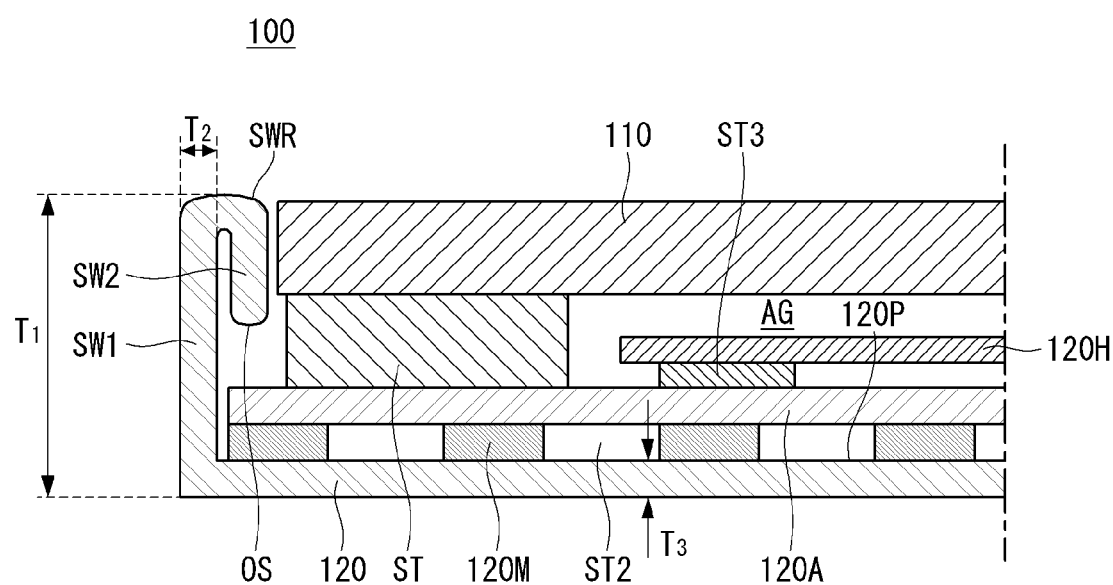
FIG. 26 illustrates an example of a display device according to an embodiment of the invention.

FIG. 26 illustrates an example of a display device according to an embodiment of the invention. A side wall SW1 can form a wall at one end of a plate portion 120P. The side wall SW1 may have a predetermined thickness T2. In order to secure rigidity required in the display device 100 while making a total thickness T1 of the display device 100 slim, a thickness T3 of the plate portion 120P, the thickness T2 of the side wall SW, and the height T1 of the side wall SW may be related to one another.

This corresponds to when the total thickness T1 of the display device 100 decreases, the thickness T3 of the plate portion 120P or the thickness T2 of the side wall SW1 decreases. Further, when the thickness T3 of the plate portion 120P or the thickness T2 of the side wall SW1 decreases, the rigidity required in the display device 100 can be reduced. Thus, because making the total thickness T1 of the display device 100 slim may result in a reduction in the rigidity required in the display device 100, the structural rigidity of the display device 100 needs to be sufficiently considered.

The display panel 110 may be inserted into a module cover 120 or attached to the module cover 120 and fixed to the module cover 120. The display panel 110 can be coupled with the module cover 120 through an adhesive member ST such as, for example, a double-sided tape or a synthetic resin.

The side wall SW can include a first side wall SW1 and a second side wall SW2. The first side wall SW1 and the second side wall SW2 can be formed as one body. The side wall SW may have a bending surface SWR and can be formed by extending the second side wall SW2 from the first side wall SW1 while bending the second side wall SW2.

The display device 100 can include a reinforcement plate 120A and an adhesive plate 120M. The reinforcement plate 120A can be positioned between the display panel 110 and the module cover 120. The adhesive plate 120M can be positioned between the module cover 120 and the reinforcement plate 120A. The adhesive plate 120M can be formed in a mesh shape and improve a coupling strength or an adhesive strength between the module cover 120 and the reinforcement plate 120A as well as structural rigidity of the module cover 120.

An adhesive ST2 can be formed between the plate portion 120P and the reinforcement plate 120A. The adhesive ST2 can be positioned in an empty space of the adhesive plate 120M. For example, an adhesive may be attached to the plate portion 120P, the adhesive plate 120M may be placed on the plate portion 120P, and the reinforcement plate 120A may be placed on the adhesive plate 120M. In this instance, the adhesive may be naturally applied to an empty space of the adhesive plate 120M.

Hence, a coupling strength or an adhesive strength of the plate portion 120P, the reinforcement plate 120A, and the adhesive plate 120M is further improved. Further, the rigidity of the module cover 120 is further improved. The rigidity of the module cover 120 can include twist rigidity as well as bending rigidity.

A heat sink 120H can be positioned on the back surface of the display panel 110. The heat sink 120H can be positioned adjacent to the back surface of the display panel 110. The heat sink 120H can be positioned between the display panel 110 and the reinforcement plate 120A.

The heat sink 120H can be coupled with the reinforcement plate 120A. The heat sink 120H can be coupled with a front surface of the reinforcement plate 120A by an adhesive member ST3. For example, the heat sink 120H can include aluminum (Al). The heat sink 120H may absorb heat generated in the display panel 110. The heat sink 120H may widely transfer the absorbed heat. Namely, the heat generated in the display panel 110 can be processed by the heat sink 120H.

In the display device 100 having the configuration of FIG. 26, a structure for securing the rigidity may be complicated, and the number of manufacturing processes or the manufacturing cost may increase. Further, heat generated in the display panel 110 may not be efficiently dissipated to the outside of the display device 100. Namely, the heat, that is generated in the display panel 110 and is transferred to the heat sink 120H, may not be smoothly dissipated from the inside to the outside of the display device 100.

Figure 27:
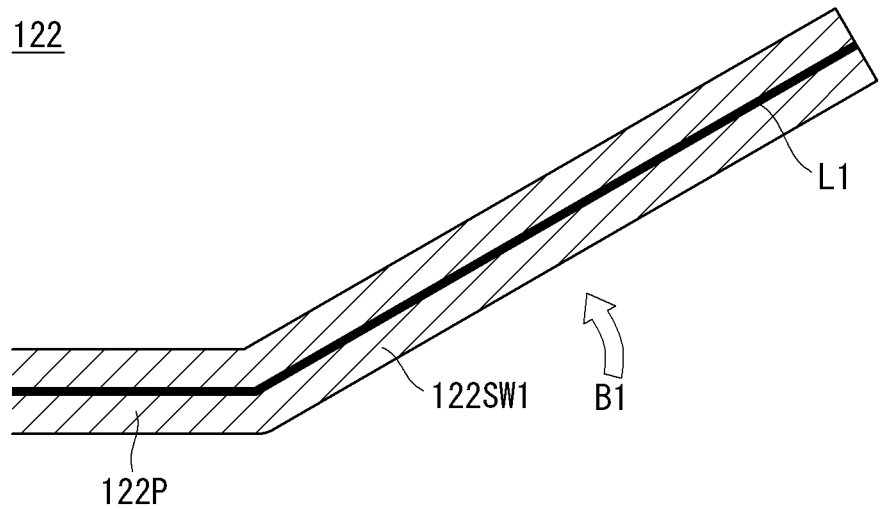
FIGS. 27 to 31 illustrate examples of bending a frame according to an embodiment of the invention.

Next, FIGS. 27 to 31 illustrate examples of bending a frame according to an embodiment of the invention. Referring to FIG. 27, a frame 122 can be bent and include a plate portion 122P and a side wall 122SW1 by the bending. The frame 122 can be bent once (including a first bending operation B1 and be bent by a press machine. In this instance, the frame 122 can be bent to form a straight line or a curved line. The frame 122 may also have the same length L1 before and after the bending.

Figure 28:
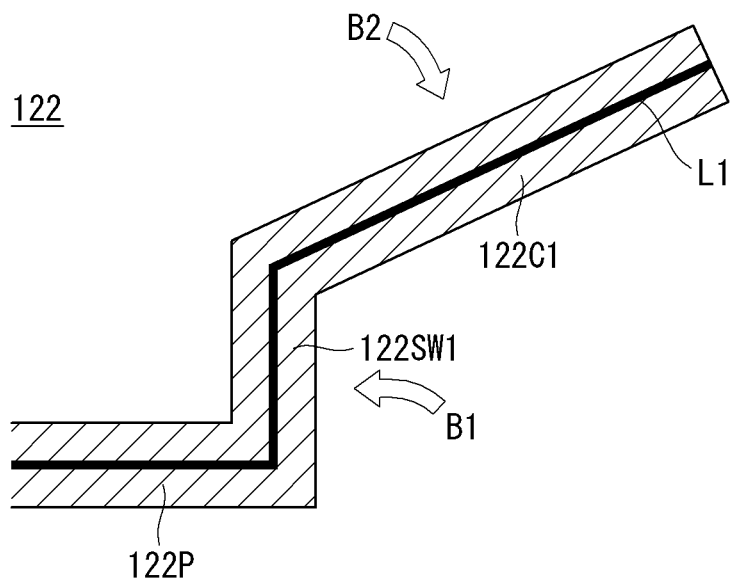

Referring to FIG. 28, the frame 122 can be bent twice (including first and second bending operations B1 and B2). A direction of the second bending operation B2 may be opposite to a direction of the first bending operation B1. For example, if the first bending operation B1 of the frame 122 is performed in a counterclockwise direction, the second bending operation B2 of the frame 122 can be performed in a clockwise direction. The frame 122 can include a plate portion 122P, a side wall 122SW1, and a bending portion 122C1 by the bending. The frame 122 may have the same length L1 before and after the bending.

Figure 29:
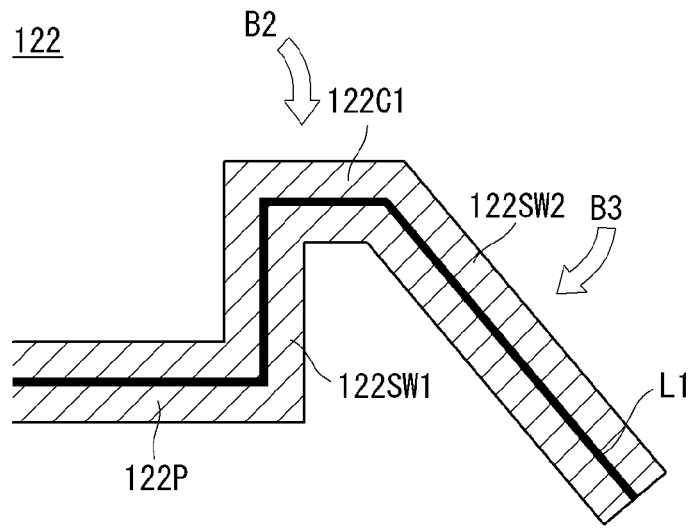

Referring to FIG. 29, the frame 122 can be bent three times (including first, second, and third bending operations B1, B2 and B3). A direction of the second bending operation B2 may be opposite to a direction of the first bending operation B1, and a direction of the third bending operation B3 may be the same as the direction of the second bending operation B2. For example, if the first bending operation B1 of the frame 122 is performed in a counterclockwise direction, the second bending operation B2 and the third bending operation B3 of the frame 122 can be performed in a clockwise direction. The frame 122 may have the same length L1 before and after the bending.

Referring to FIG. 29, the frame 122 can include a first side wall 122SW1, a bending portion 122C1, and a second side wall 122SW2 by the bending. The first side wall 122SW1 can be positioned at an edge of a plate portion 122P. The first side wall 122SW1 can be extended from the edge of the plate portion 122P. The second side wall 122SW2 can be positioned on one side of the first side wall 122SW1. The second side wall 122SW2 can be positioned outside the first side wall 122SW1. Namely, the first side wall 122SW1 can be positioned between the plate portion 122P and the second side wall 122SW2. The second side wall 122SW2 can be positioned in parallel with the first side wall 122SW1. An air gap AG can be formed between the first side wall 122SW1 and the second side wall 122SW2.

The bending portion 122C1 may connect the first side wall 122SW1 and the second side wall 122SW2. The bending portion 122C1 may connect one end of the first side wall 122SW1 to the second side wall 122SW2. The second side wall 122SW2 can be extended longer than the first side wall 122SW1. Namely, a length or a height of the second side wall 122SW2 may be greater than a length or a height of the first side wall 122SW1.

Figure 30:
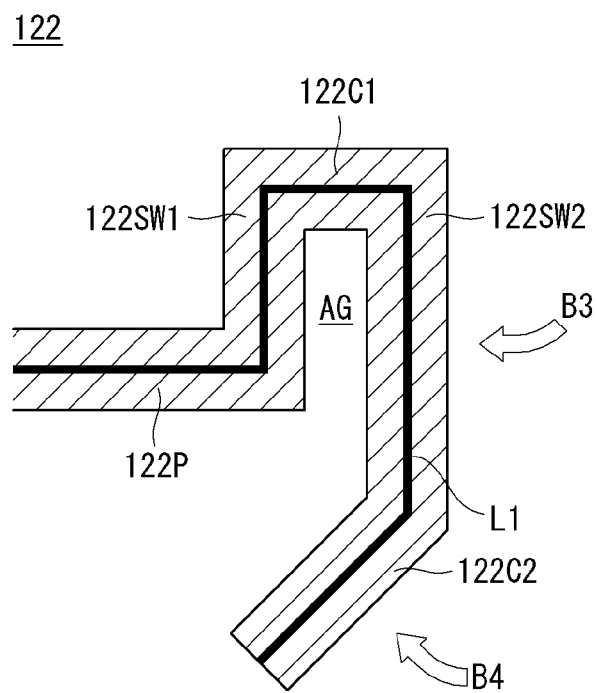

Referring to FIG. 30, the frame 122 can be bent four times (including first, second, third, and fourth bending operations B1, B2, B3 and B4). A direction of the fourth bending operation B4 may be the same as the direction of the third bending operation B3. For example, if the third bending operation B3 of the frame 122 is performed in a clockwise direction, the fourth bending operation B4 of the frame 122 can be performed in the clockwise direction. The frame 122 may have the same length L1 before and after the bending.

The frame 122 can include a first side wall 122SW1, a first bending portion 122C1, a second side wall 122SW2, and a second bending portion 122C2 by the bending. The second bending portion 122C2 can be extended from one end of the second side wall 122SW2. The second bending portion 122C2 can be positioned opposite the first bending portion 122C1. An air gap AG can be formed between the first bending portion 122C1 and the second bending portion 122C2. The second bending portion 122C2 can be positioned on a lower part of a plate portion 122P or the first side wall 122SW1.

Figure 31:
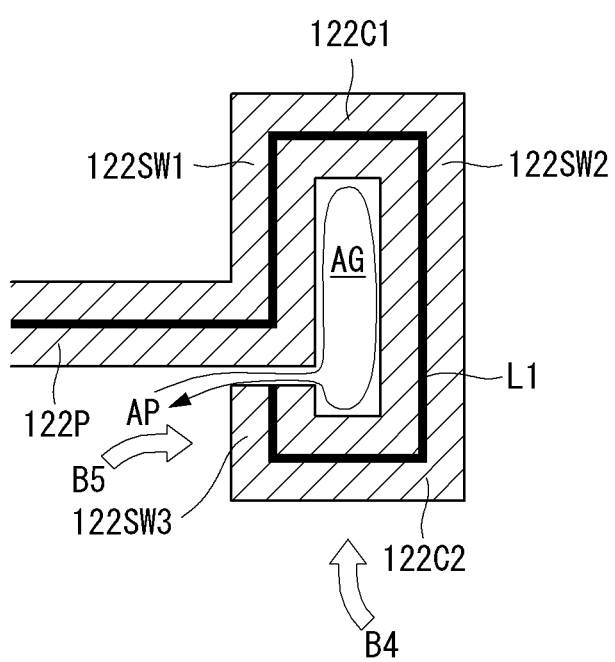

Referring to FIG. 31, the frame 122 can be bent five times (including first, second, third, fourth, and fifth bending operations B1, B2, B3, B4 and B5). A direction of the fifth bending operation B5 may be the same as the direction of the fourth bending operation B4. For example, if the fourth bending operation B4 of the frame 122 is performed in a clockwise direction, the fifth bending operation B5 of the frame 122 can be performed in the clockwise direction. The frame 122 may have the same length L1 before and after the bending.

The frame 122 can include a first side wall 122SW1, a second side wall 122SW2, a first bending portion 122C1, a second bending portion 122C2, and a third side wall 122SW3 by the bending. The first side wall 122SW1 can be positioned at an edge of a plate portion 122P, and the second side wall 122SW2 can be positioned in parallel with the first side wall 122SW1. The first side wall 122SW1 can be positioned between the plate portion 122P and the second side wall 122SW2. The first bending portion 122C1 can connect the first side wall 122SW1 and the second side wall 122SW2.

The third side wall 122SW3 can be positioned on one side of the second side wall 122SW2. The third side wall 122SW3 can be positioned inside the second side wall 122SW2. Namely, the third side wall 122SW3 can be positioned between the plate portion 122P and the second side wall 122SW2. The third side wall 122SW3 can be positioned on a lower part of the first side wall 122SW1. In this instance, the third side wall 122SW3 may be adjacent to the plate portion 122P while being positioned on the lower part of the first side wall 122SW1. Further, the third side wall 122SW3 may be separated from the first side wall 122SW1 or the plate portion 122P. Namely, an air gap AG can be formed between the third side wall 122SW3 and the first side wall 122SW1 or between the third side wall 122SW3 and the plate portion 122P.

The length L1 of the frame 122 described above can be converted into a surface area of the frame 122. Namely, when the frame 122 is bent while maintaining the same length L1, the frame 122 can be bent while maintaining the same surface area. In addition, the surface area of the frame 122 can increase by the bending of the frame 122. The fact that the surface area of the frame 122 increases means the frame 122 efficiently transfers heat to the outside. Thus, heat dissipation efficiency of the frame 122 can be improved. Namely, heat dissipation of the frame 122 can be improved due to the bending of the frame 122 in a limited space.

In addition, an air path AP can be formed at one side of the frame 122. The air path AP can be connected to the outside of the display device 100. Namely, air can enter from and/or may be discharged to the outside of the display device 100. The air may enter and/or may be discharged through the above-described air gap AG. In other words, the air gap AG can be used as the air path AP.

Heat, that is transferred to the frame 122 through the air path AP formed by bending the frame 122 several times, can be dissipated to the outside of the display device 100. Namely, the heat dissipation of the frame 122 can be improved through the bending of the frame 122.

Figure 32:
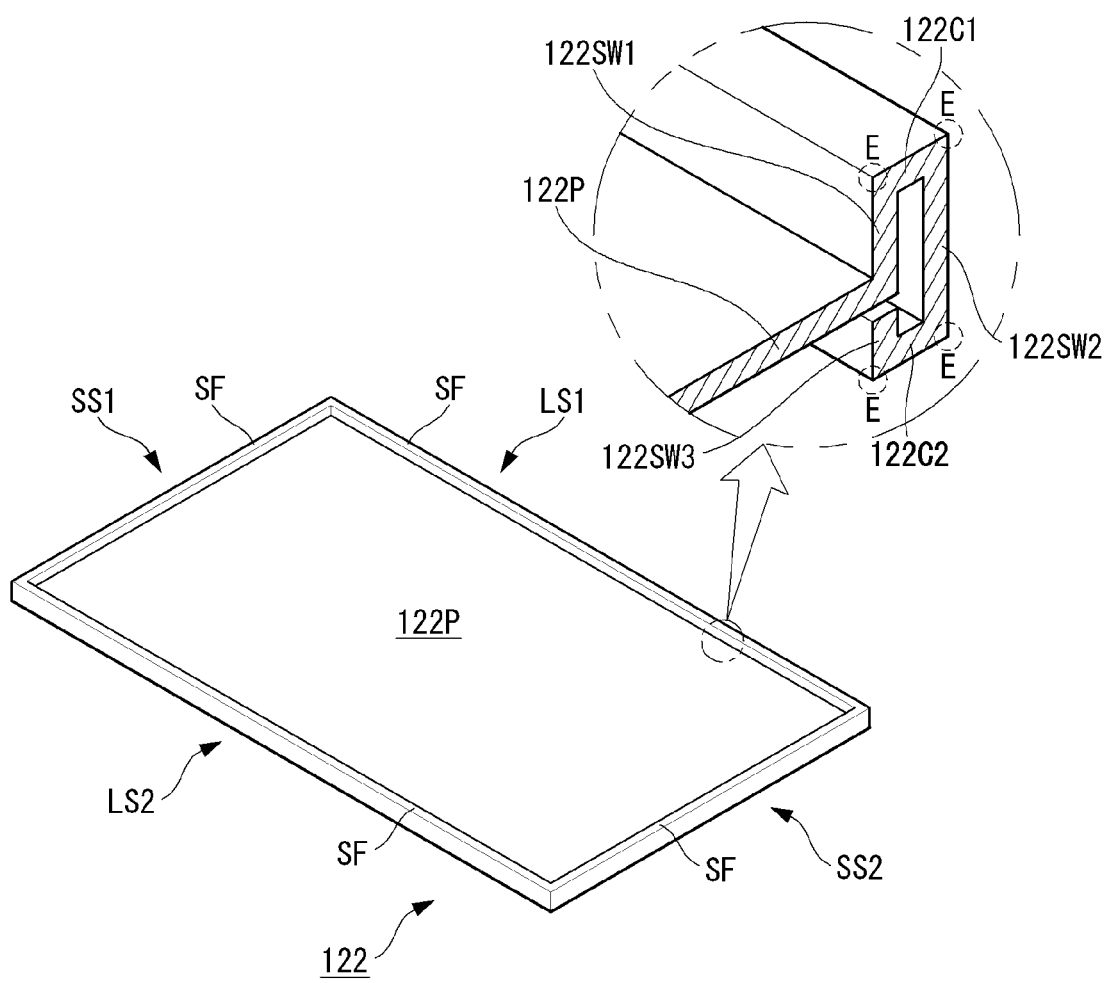
FIGS. 32 to 35 illustrate examples of a side or a corner of a display device according to an embodiment of the invention.

Next, FIGS. 32 to 35 illustrate examples of one side or one corner of a display device according to an embodiment of the invention. Referring to FIG. 32, a frame 122 can include a side frame SF on one side. The side frame SF can be positioned at an edge of a plate portion 122P. The side frame SF can be positioned on an upper side, a lower side, a left side, and/or a right side of the plate portion 122P. The side frame SF can be formed along a perimeter of the plate portion 122P.

For example, the side frame SF can be formed on a first long side LS1, a second long side LS2, a first short side SS1, and/or a second short side SS2 of the plate portion 122P. The side frame SF can include a first side wall 122SW1, a second side wall 122SW2, a third side wall 122SW3, a first bending portion 122C1, and a second bending portion 122C2. The side frame SF may be referred to as a heat sink. The side frame SF may be referred to as a rigid roll.

The first side wall 122SW1 and the first bending portion 122C1 can form an edge E, the first bending portion 122C1 and the second side wall 122SW2 can form an edge E, the second side wall 122SW2 and the second bending portion 122C2 can form an edge E, and/or the second bending portion 122C2 and the third side wall 122SW3 can form an edge E.

Figure 33:
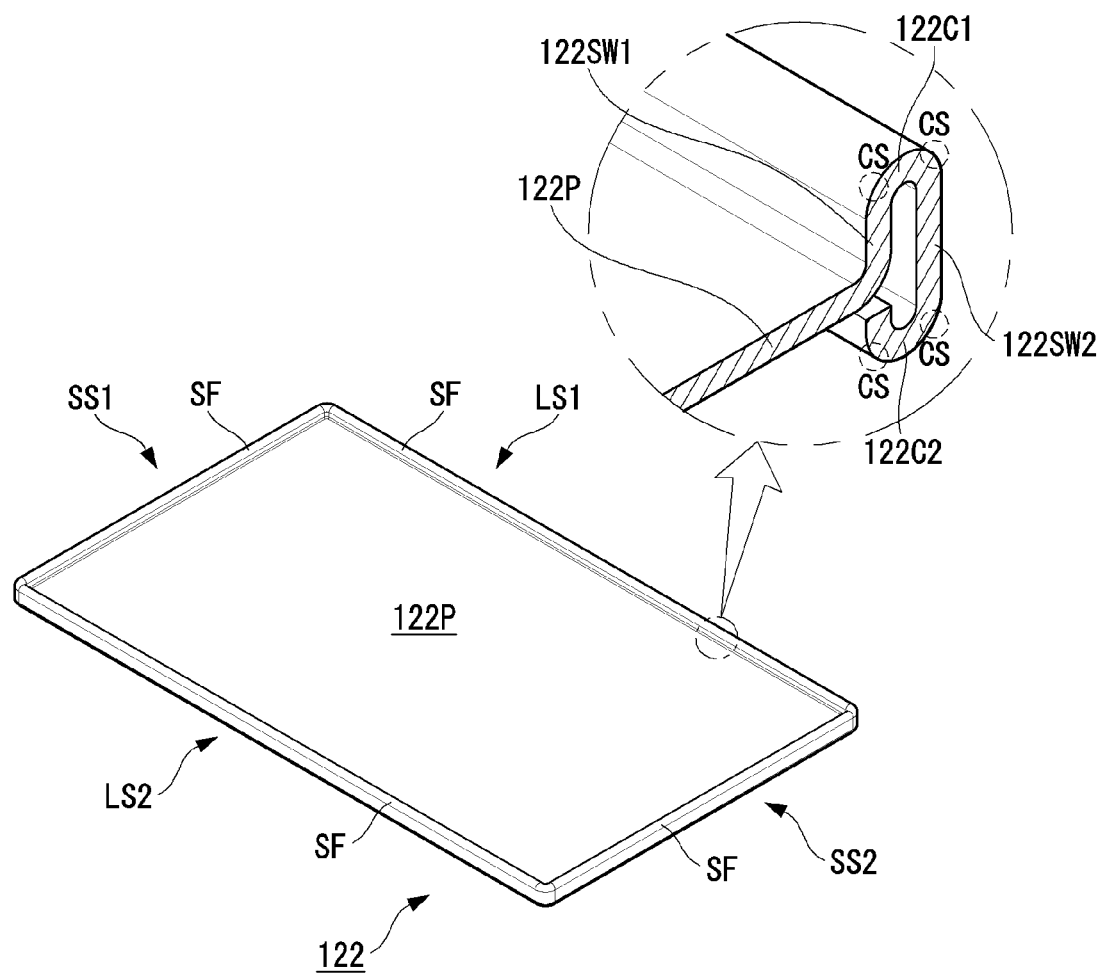

Referring to FIG. 33, the first side wall 122SW1 and the first bending portion 122C1 can form a curved surface CS, the first bending portion 122C1 and the second side wall 122SW2 can form a curved surface CS, the second side wall 122SW2 and the second bending portion 122C2 can form a curved surface CS, and/or the second bending portion 122C2 and the third side wall 122SW3 can form a curved surface CS.

Figure 34:
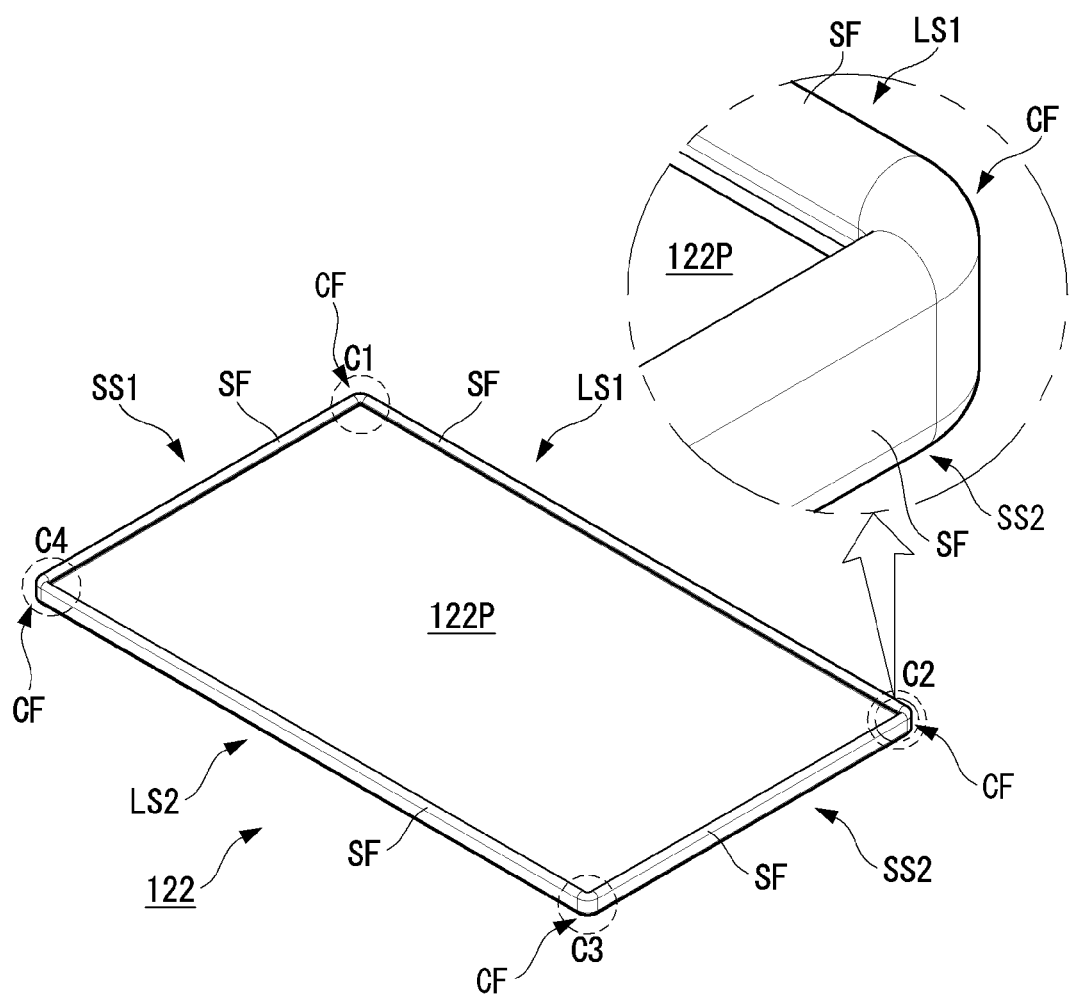

Referring to FIG. 34, the frame 122 can include a corner frame CF on corners C1 to C4 of a plate portion 122P. The corner frame CF may be connected to a side frame SF. The corner frame CF may be connected to a plurality of side frames SF. The corner frame CF can be positioned on a first corner C1, a second corner C2, a third corner C3, and/or a fourth corner C4 of the plate portion 122P. For example, the corner frame CF positioned on the second corner C2 of the plate portion 122P may connect a side frame SF positioned on the first long side LS1 to a side frame SF positioned on the second short side SS2.

Figure 35:
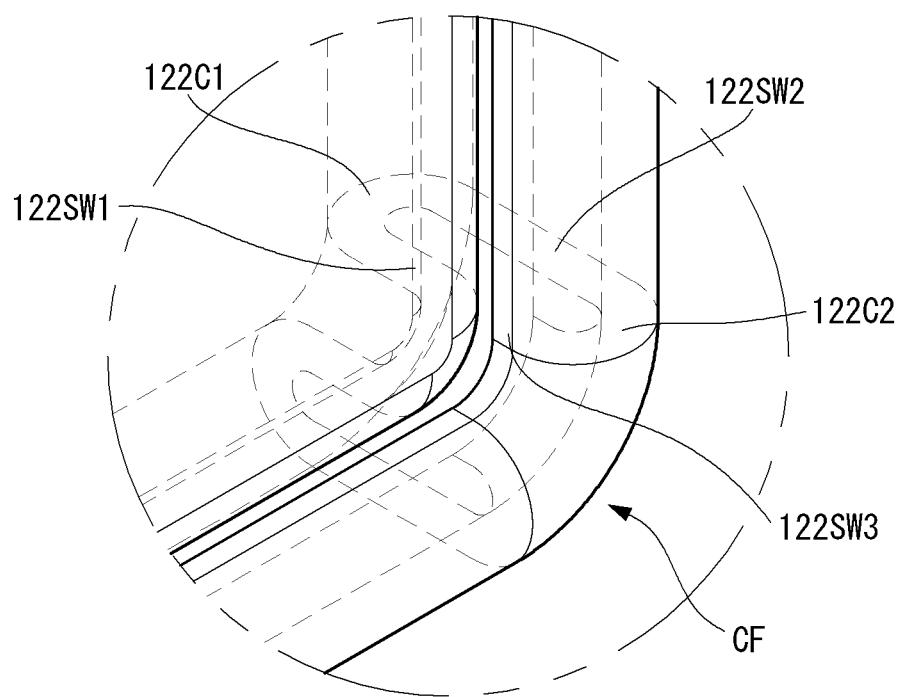

Referring to FIG. 35, a corner frame CF can include a first side wall 122SW1, a second side wall 122SW2, a third side wall 122SW3, a first bending portion 122C1, and a second bending portion 122C2. The corner frame CF may be referred to as a heat sink. The first side wall 122SW1 and the first bending portion 122C1 can form a curved surface CS, the first bending portion 122C1 and the second side wall 122SW2 can form a curved surface CS, the second side wall 122SW2 and the second bending portion 122C2 can form a curved surface CS, and/or the second bending portion 122C2 and the third side wall 122SW3 can form a curved surface CS.

Figure 36:
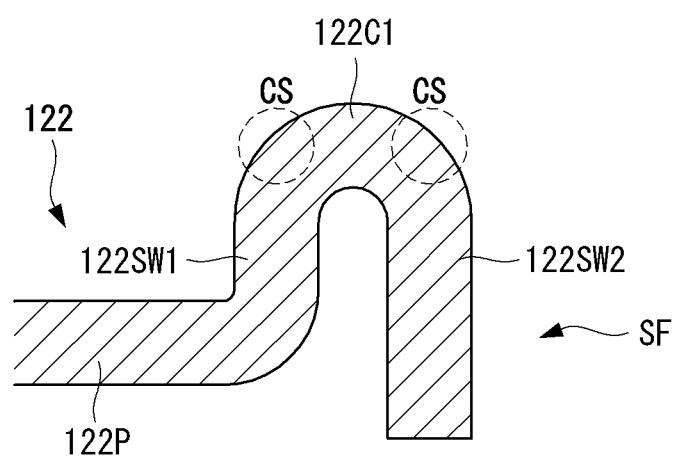
FIGS. 36 and 37 illustrate examples of a heat dissipation effect of a display device according to an embodiment of the invention.
Figure 36:
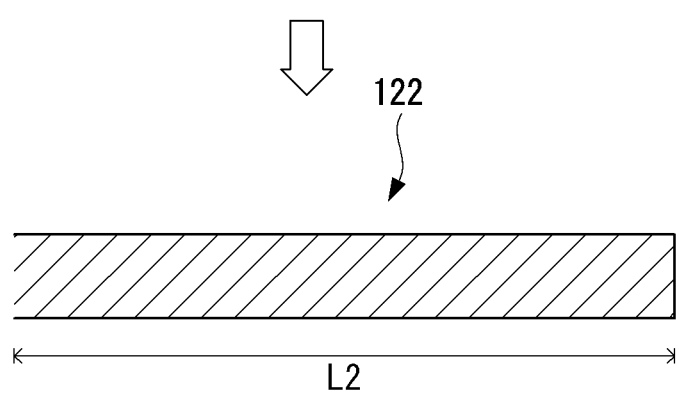
Figure 37:
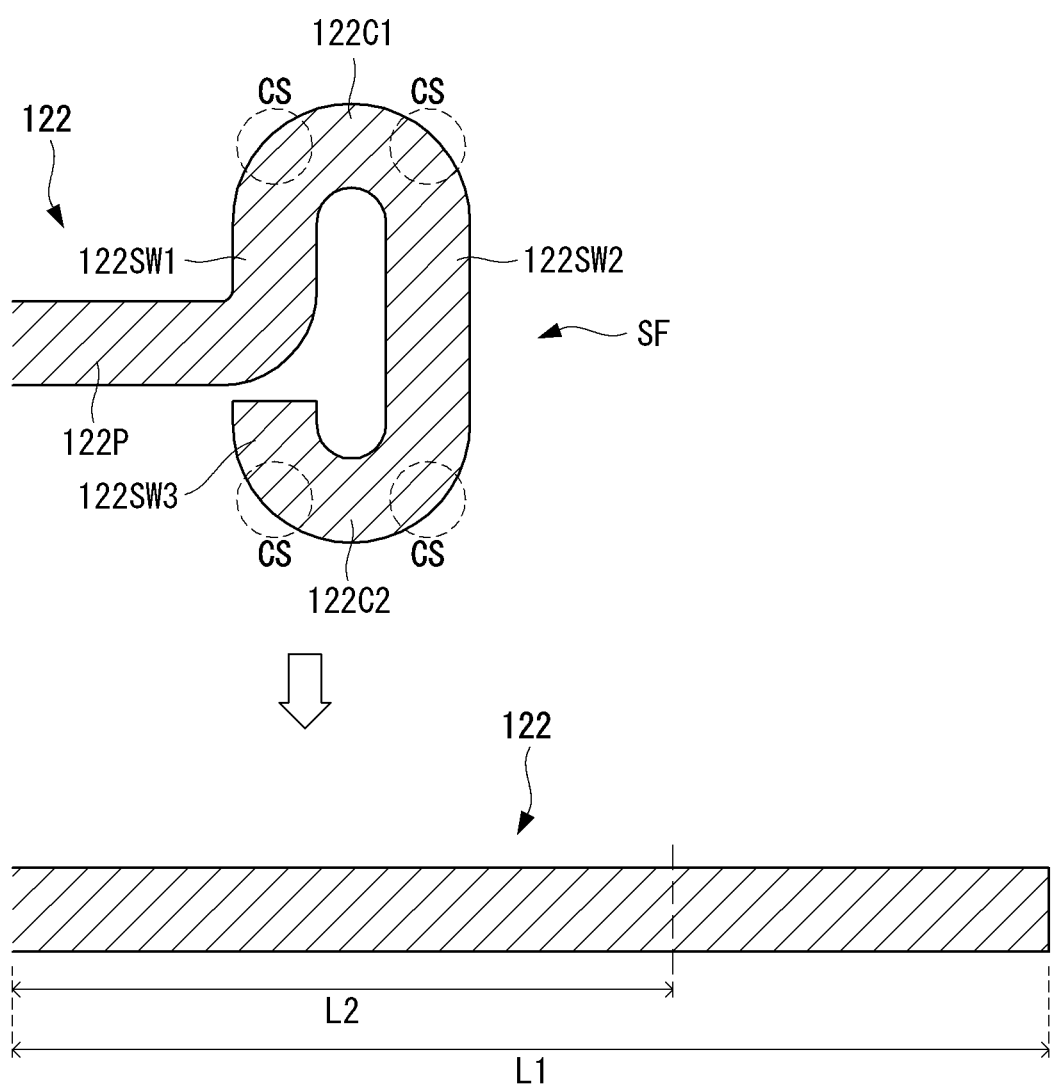

FIGS. 36 and 37 illustrate examples of a heat dissipation effect of a display device according to an embodiment of the invention. Referring to FIG. 36, a frame 122 can include a plate portion 122P and a side frame SF. The side frame SF can be positioned at an edge of the plate portion 122P. The side frame SF can be extended from the plate portion 122P. The side frame SF can include a first side wall 122SW1, a second side wall 122SW2, and a first bending portion 122C1.

The first side wall 122SW1 may be vertical to the plate portion 122P at one end or the edge of the plate portion 122P. The second side wall 122SW2 can be positioned next to the first side wall 122SW1. In this instance, the second side wall 122SW2 can be positioned outside the plate portion 122P and the first side wall 122SW1. The second side wall 122SW2 may be separated from the first side wall 122SW1. The first side wall 122SW1 may be connected to the second side wall 122SW2. Also, the first bending portion 122C1 may connect the first side wall 122SW1 and the second side wall 122SW2. The first bending portion 122C1 may have a curved surface. If the frame 122 is flat, a length of the frame 122 may be "L2".

Referring to FIG. 37, a frame 122 can include a plate portion 122P and a side frame SF. The side frame SF can be positioned at an edge of the plate portion 122P and be extended from the plate portion 122P. The side frame SF can include a first side wall 122SW1, a second side wall 122SW2, a third side wall 122SW3, a first bending portion 122C1, and a second bending portion 122C2.

Further, the first side wall 122SW1 may be vertical to the plate portion 122P at one end or the edge of the plate portion 122P. The second side wall 122SW2 can be positioned next to the first side wall 122SW1. In this instance, the second side wall 122SW2 can be positioned outside the plate portion 122P and the first side wall 122SW1. The second side wall 122SW2 may be separated from the first side wall 122SW1. The first side wall 122SW1 may be connected to the second side wall 122SW2. The first bending portion 122C1 may connect the first side wall 122SW1 and the second side wall 122SW2. The first bending portion 122C1 may have a curved surface.

The third side wall 122SW3 can be positioned on the lower side of the first side wall 122SW1. The third side wall 122SW3 can be positioned between the second side wall 122SW2 and the plate portion 122P. The third side wall 122SW3 may be separated from the plate portion 122P or the first side wall 122SW1. The second bending portion 122C2 may connect the second side wall 122SW2 and the third side wall 122SW3. The second bending portion 122C2 can be extended from the second side wall 122SW2 to the third side wall 122SW3.

If the frame 122 is flat, a length of the frame 122 may be "L1", where L1 is greater than L2. This may indicate that a surface area of the frame 122 shown in FIG. 37 is greater than a surface area of the frame 122 shown in FIG. 36. Further, this corresponds to a heat dissipation ability of the frame 122 shown in FIG. 37 is better than a heat dissipation ability of the frame 122 shown in FIG. 36. Areas occupied by the frames 122 or the side frames SF shown in FIGS. 36 and 37 may have the same spatial limitation. Namely, this corresponds to a heat dissipation effect of the frame 122 shown in FIG. 37 is better than a heat dissipation effect of the frame 122 shown in FIG. 36 under the same spatial conditions.

At the same time, the frame 122 including the above-described side frame SF may provide sufficient rigidity against a bending force or a twist force, which can be applied to the plate portion 122P. Namely, as the display device 100 becomes the slimmer and large-area display device, the above-described frame 122 can sufficiently provide the necessary rigidity for the display device 100.

When the side frame SF is formed on the upper, lower, left and right sides of the plate portion 122P, the heat dissipation ability of the frame 122 is further improved. Further, the frame 122 can provide more sufficient rigidity for the display device 100.

Figure 38:
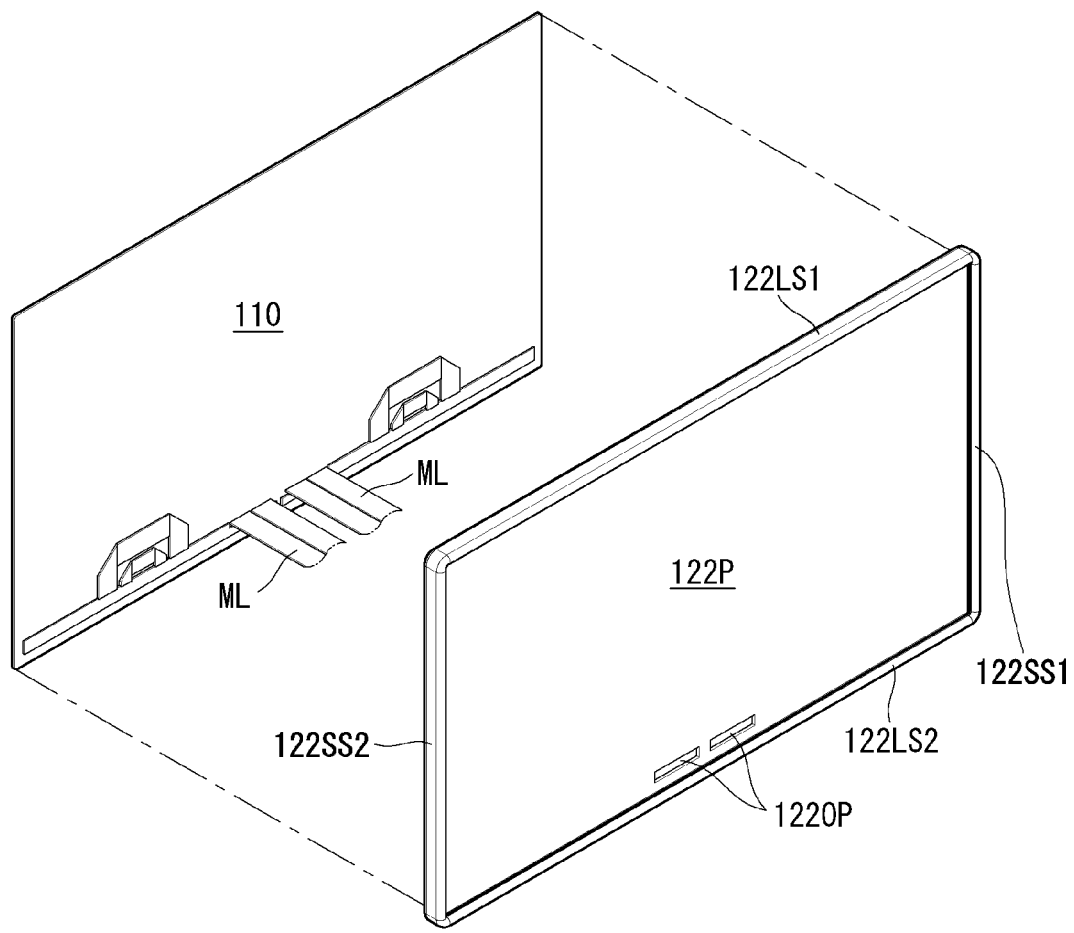
FIGS. 38 and 39 illustrate coupling examples of a display panel according to an embodiment of the invention.
Figure 39:
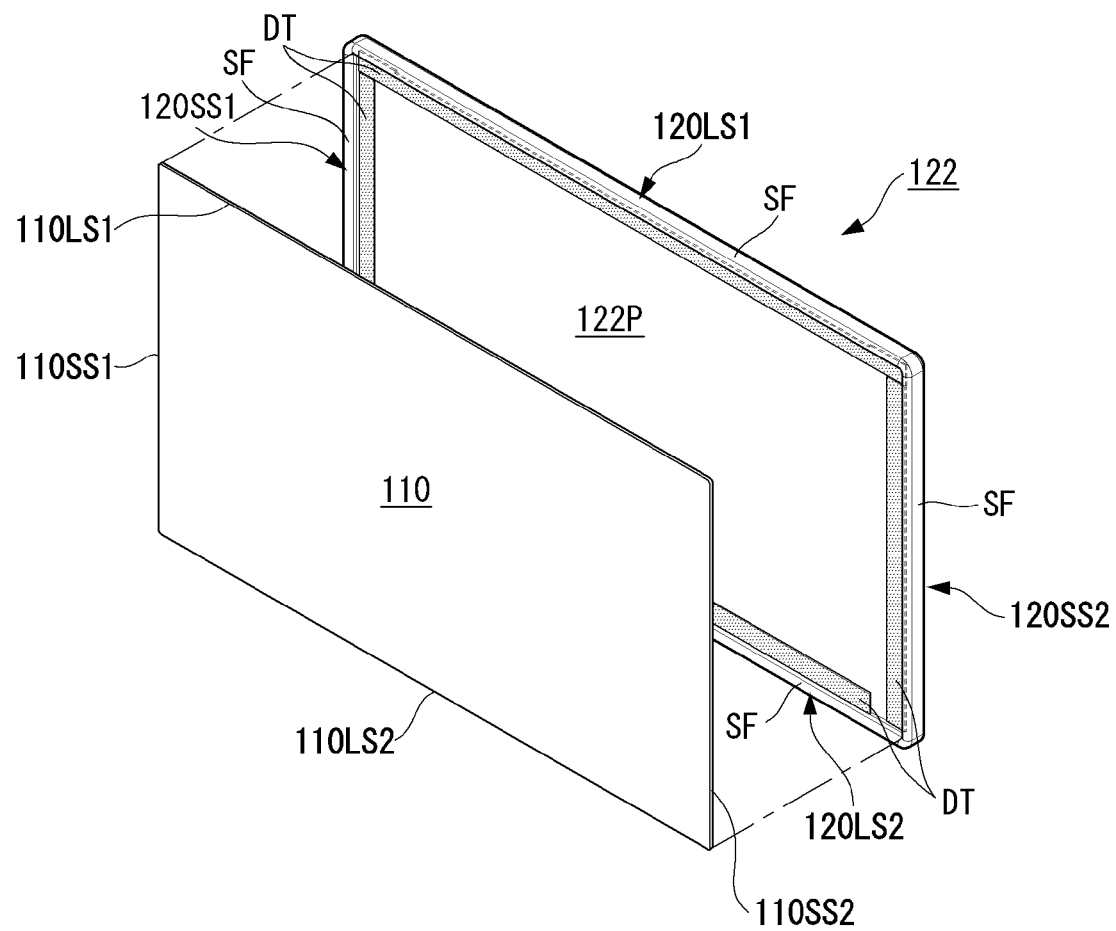

Next, FIGS. 38 and 39 illustrate coupling examples of a display panel according to an embodiment of the invention. Referring to FIG. 38, the display panel 110 can include a member layer ML. For example, the display panel 110 may be an OLED display panel, and the member layer ML may be a chip-on-film (COF), a chip-on-glass (COG), a flexible printed circuit board (FPCB), a tape carrier package (TCP), and the like. The member layer ML can be extended from a lower end of the display panel 110 to a back surface of the display panel 110.

A frame 122 can include an opening 122OP. The opening 122OP can be formed in a plate portion 122P. The opening 122OP may pass through a front surface and a back surface of the plate portion 122P. The opening 122OP can be positioned adjacent to one side of the plate portion 122P. The opening 122OP can be positioned adjacent to a second long side 122LS2 of the plate portion 122P. A plurality of openings 122OP can be formed. For example, when the two member layers ML at the back surface of the display panel 110 face toward the frame 122, two openings 122OP can be formed, and the two member layers ML may pass through the two openings 122OP.

Referring to FIG. 39, the display panel 110 can be positioned on the front surface of the frame 122. The display panel 110 can be positioned inside the side frame SF. Namely, the back surface of the display panel 110 may be covered by the plate portion 122P, and the side of the display panel 110 may be covered by the side frame SF. An adhesive member DT can be positioned between the display panel 110 and the plate portion 122P. One surface of the adhesive member DT may be attached to the plate portion 122P, and the other surface may be attached to the display panel 110. Hence, the display panel 110 may be fixed to the frame 122.

The adhesive member DT may be adjacent to a border of the plate portion 122P or can be positioned along an outer perimeter of the plate portion 122P. Namely, the adhesive member DT may be adjacent to an edge of the plate portion 122P and attached to a front surface of the plate portion 122P. Hence, heat generated in the display panel 110 may be directly transferred uniformly to the plate portion 122P of the frame 122.

The above-described frame 122 may be referred to as a front frame. The front frame 122 may be referred to as a first frame. In the following description, the embodiment of the invention is described using the front frame 122 as the above-described frame 122.

Figure 40:
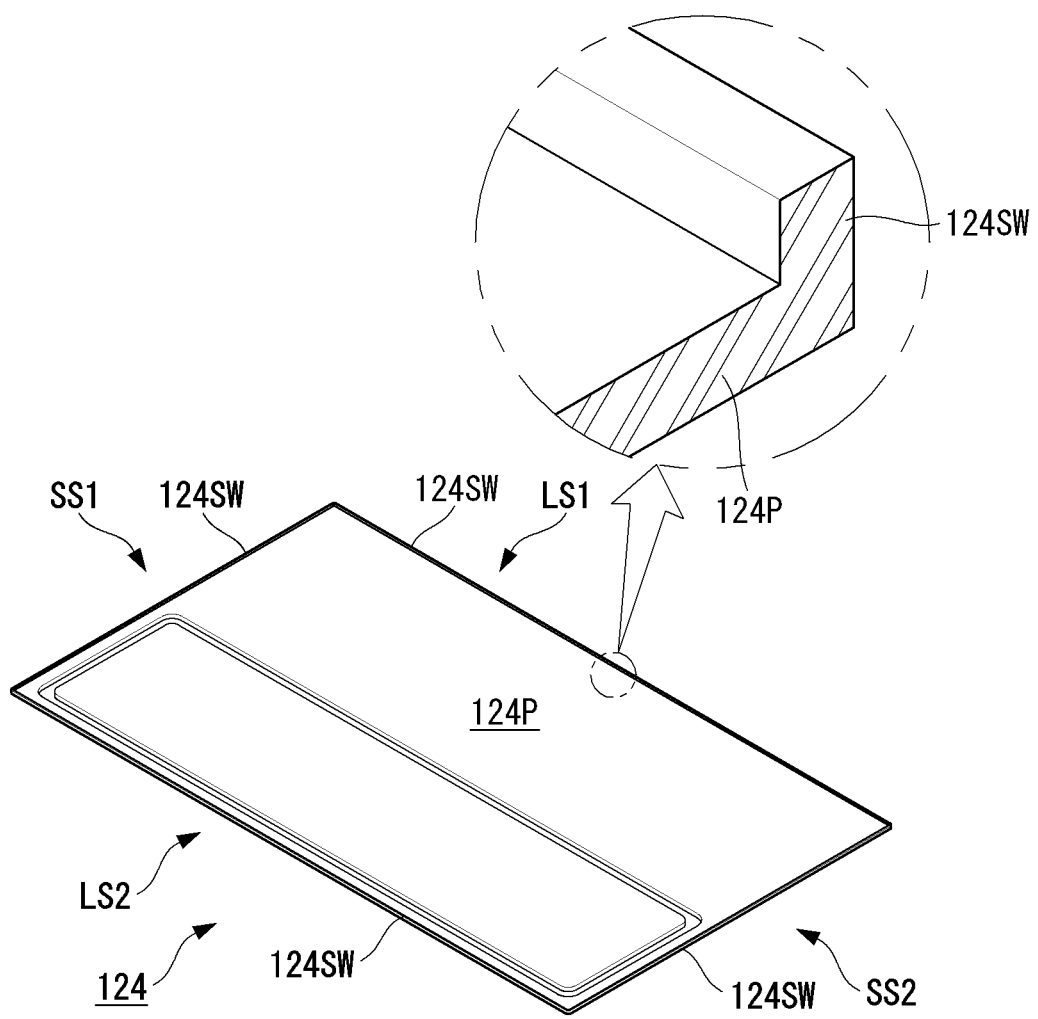
FIGS. 40 to 44 illustrate coupling examples of a display device according to an embodiment of the invention.

FIGS. 40 to 44 illustrate coupling examples of a display device according to an embodiment of the invention. Referring to FIG. 40, a rear frame 124 can include a plate portion 124P and a side wall 124SW. The side wall 124SW can be positioned on one side of the plate portion 124P. The side wall 124SW can be formed on one side or all of sides of the rear frame 124. Hence, the bending rigidity or twist rigidity of the rear frame 124 can be improved. For example, a thickness of the rear frame 124 may be 0.8 mm. The side wall 124SW may be omitted, if necessary or desired. The rear frame 124 may be referred to as a second frame.

Figure 41:
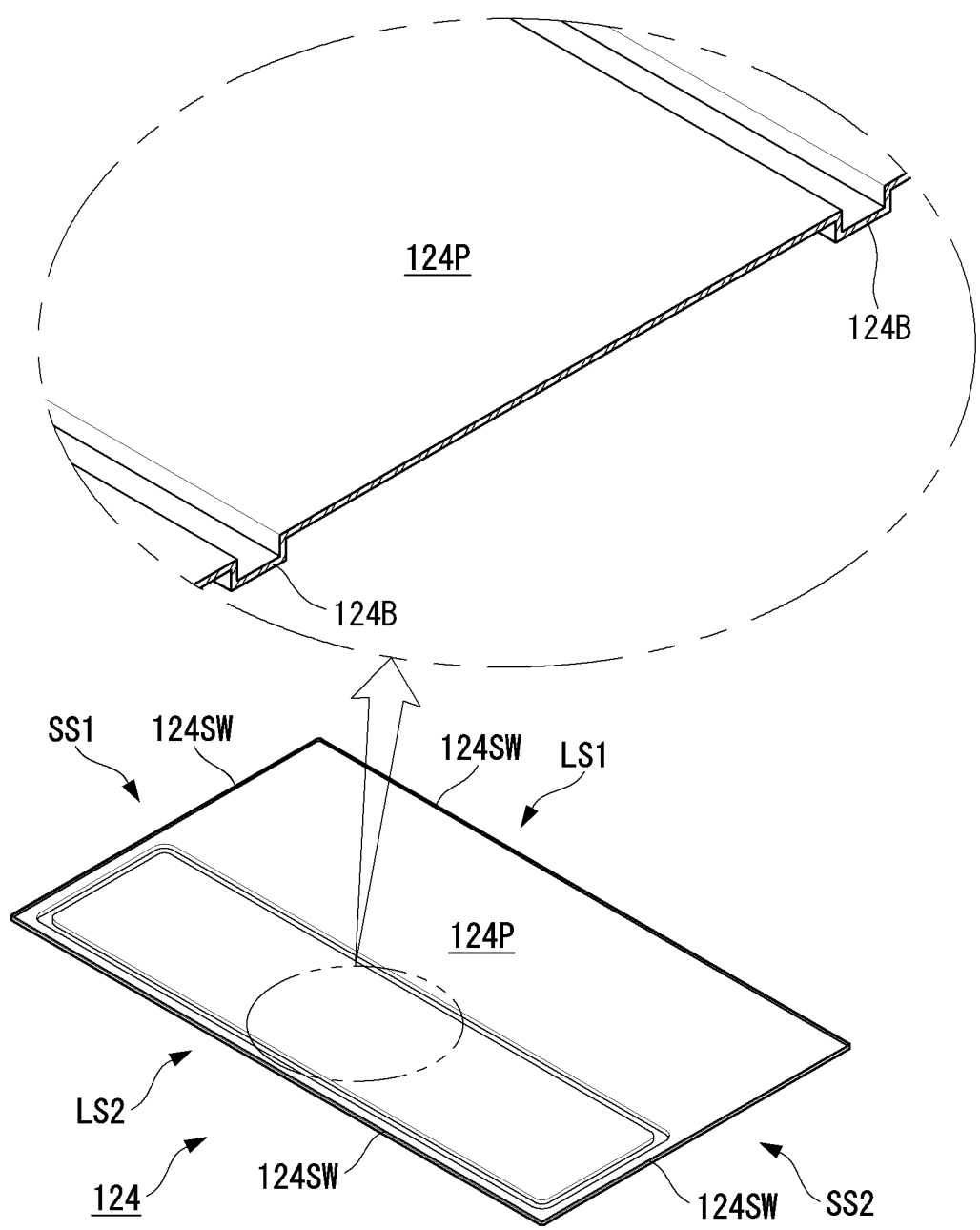

Referring to FIG. 41, a portion of the plate portion 124P may be pressed. A portion of a back surface of the plate portion 124P can protrude. In addition, a portion of a front surface of the plate portion 124P can be depressed. Namely, this means a portion of the plate portion 124P is pressed.

The plate portion 124P can include a beam 124B. Further, the beam 124B and the plate portion 124P can be formed as one body. The beam 124B can be formed by pressing a portion of the plate portion 124P. The beam 124B can be formed by depressing a portion of the front surface of the plate portion 124P and protruding a portion of the back surface of the plate portion 124P. The beam 124B can also form a definite line, or can form an infinite line. The infinite line may mean a closed loop or a circuit. Hence, the bending rigidity or the twist rigidity of the rear frame 124 can be improved.

Figure 42:
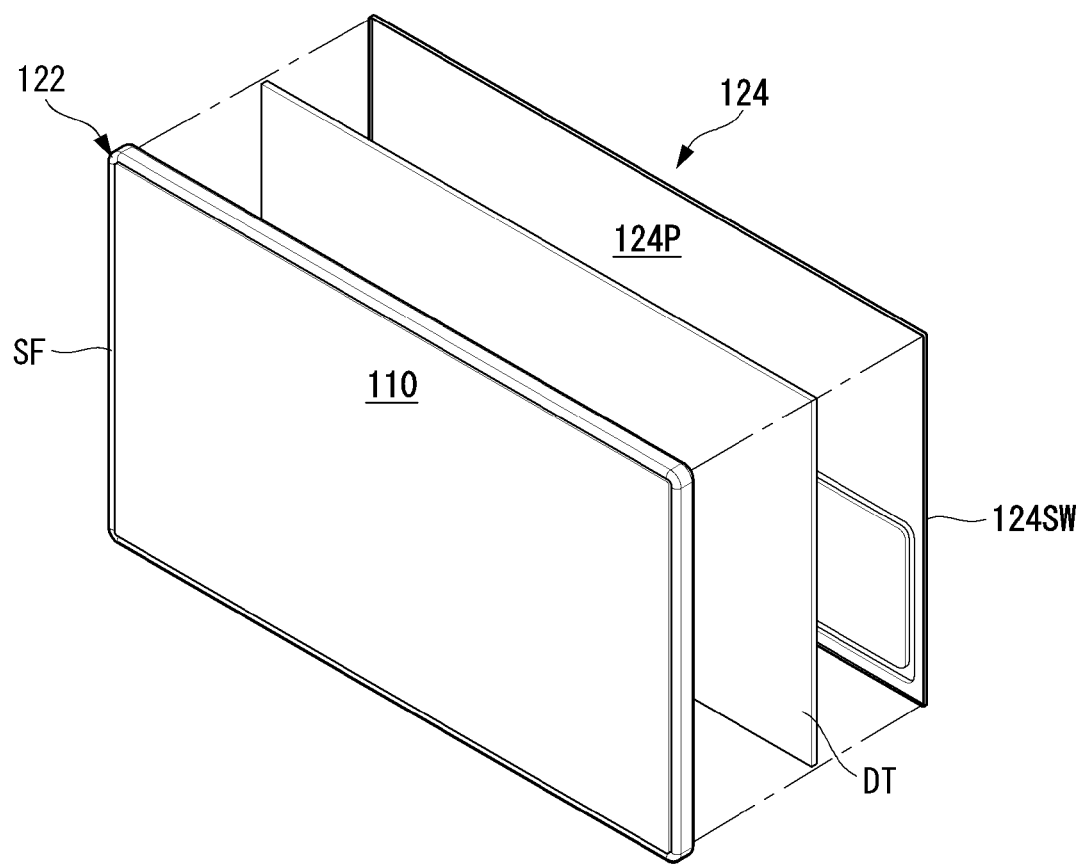

Referring to FIG. 42, the rear frame 124 can be coupled with the front frame 122. The rear frame 124 can be coupled with a back surface of the front frame 122. An adhesive member DT can be positioned between the front frame 122 and the rear frame 124. The rear frame 124 may be bonded to the front frame 122 using the adhesive member DT. In this instance, the side frame SF of the front frame 122 can be positioned on the side of the front frame 122. Namely, the rear frame 124 may be inserted into the front frame 122.

Figure 43:
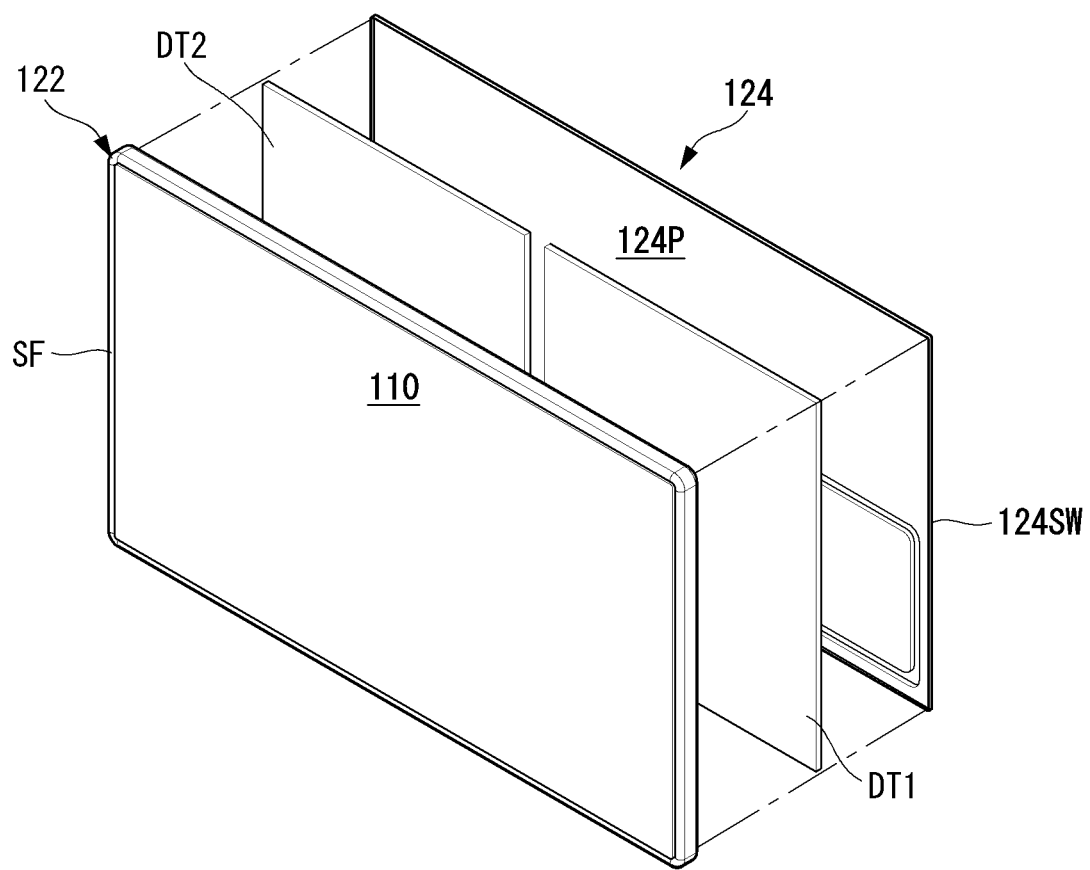

Referring to FIG. 43, a plurality of adhesive members DT may be used. The plurality of adhesive members DT can be arranged adjacent to each other in a vertical or horizontal direction, in order to secure the coupling stability while sufficiently securing the rigidity against a bending force or a twist force after the front frame 122 and the rear frame 124 are coupled. Namely, because a plurality of adhesive members DT1 and DT2 are disposed at a predetermined distance therebetween, a predetermined gap can be formed between the front frame 122 and the rear frame 124.

For example, the front frame 122 may be made of a metal containing iron (Fe), and the rear frame 124 may be made of a metal containing aluminum (Al). Thus, the front frame 122 and the rear frame 124 may have different thermal expansion coefficients. Hence, when the front frame 122 and the rear frame 124 are processed at a high temperature or a low temperature after the front frame 122 and the rear frame 124 are coupled, the front frame 122 and the rear frame 124 can be differently expanded. The plurality of adhesive members DT1 and DT2 can also prevent a twist phenomenon, which can be generated by a thermal expansion difference between the frames 122 and 124.

As another example, the front frame 122 may be made of a metal containing aluminum (Al), and the rear frame 124 may be made of a metal containing aluminum (Al). Thus, the front frame 122 and the rear frame 124 may have the same thermal expansion coefficient. In this instance, the display panel 110 may be closer to the front frame 122 than the rear frame 124. Thus, the front frame 122 may be directly exposed to heat generated in the display panel 110. Namely, a twist phenomenon, that may be generated because the metals have different exposure degrees with respect to heat even if the metals have the same thermal expansion coefficient, may be prevented by the plurality of adhesive members DT1 and DT2.

Figure 44:
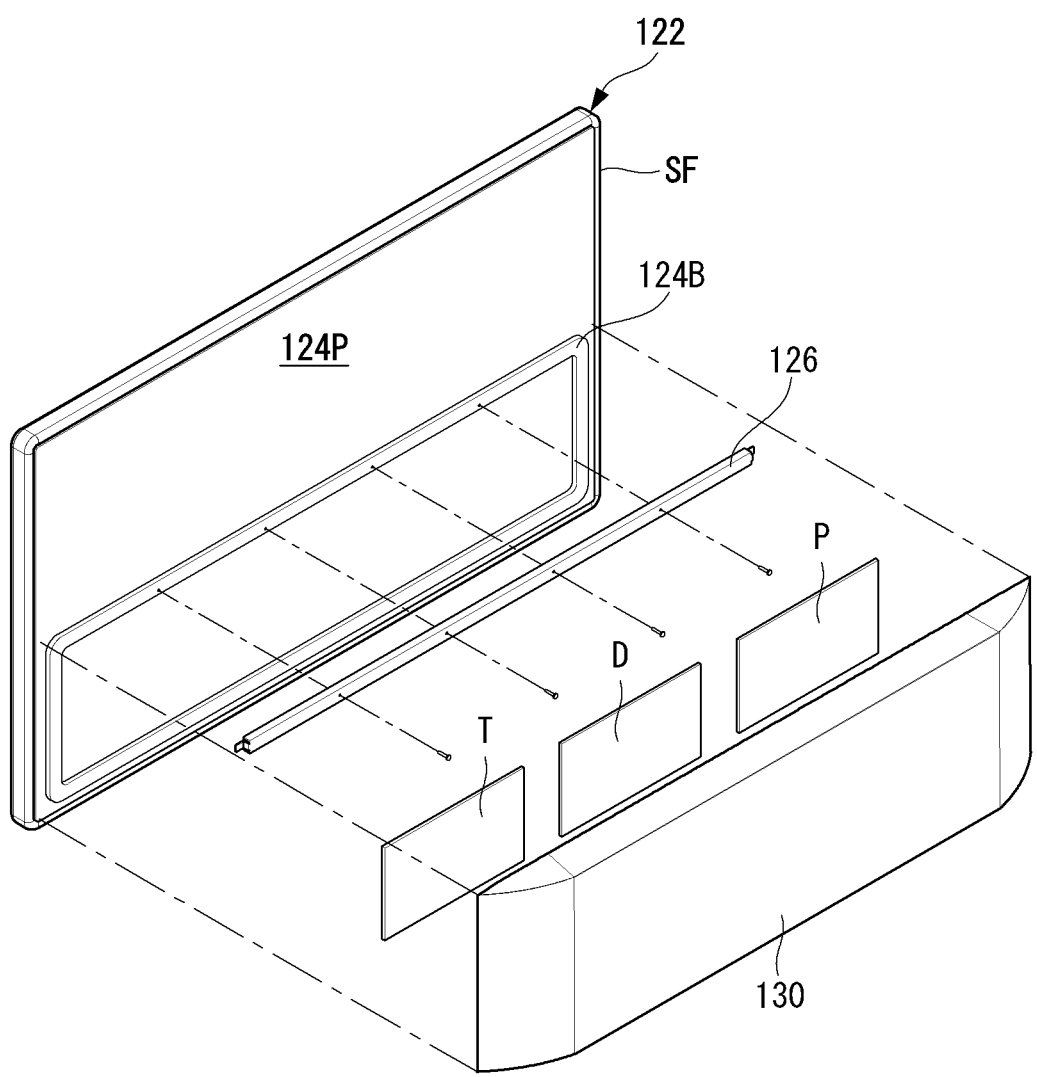
Figure 45:
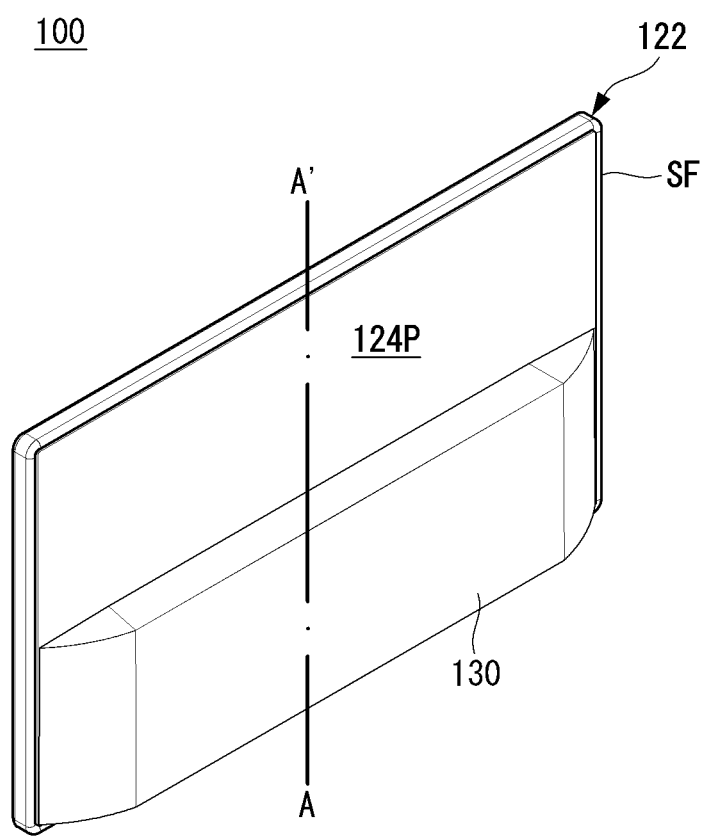
FIGS. 45 to 49 illustrate examples of a cross section of a display device according to an embodiment of the invention.

Referring to FIG. 44, a rigid beam (or a rigid bar) 126 can be coupled with the rear frame 124. The rigid beam 126 can be coupled with a back surface of the rear frame 124. The rigid beam 126 can be coupled with a beam 124B protruding from the back surface of the rear frame 124. The coupling between the rigid beam 126 and the beam 124B can be performed through a rivet or a bolt. The rigid beam 126 can be formed on an upper side of the beam 124B formed on the back surface of the rear frame 124. The rigid beam 126 may further improve the bending rigidity or the twist rigidity of the rear frame 124.

A power supply unit P, a driver D, and/or a tuner T may be installed inside the beam 124B. When the beam 124B forms a closed loop or a circuit and protrudes from the back surface of the rear frame 124, the power supply unit P, the driver D, and/or the tuner T may be installed inside the beam 124B. A back cover 130 may cover the power supply unit P, the driver D, and/or the tuner T while being coupled with the beam 124B or the rigid beam 126.

FIGS. 45 to 49 illustrate examples of one cross section of a display device according to an embodiment of the invention. More specifically, FIGS. 46 to 49 illustrate cross sections of the display device 100 taken along line A-A' of FIG. 45. FIGS. 46 to 49 illustrate upper, left, right and/or lower cross sections of the display device 100.

Figure 46:
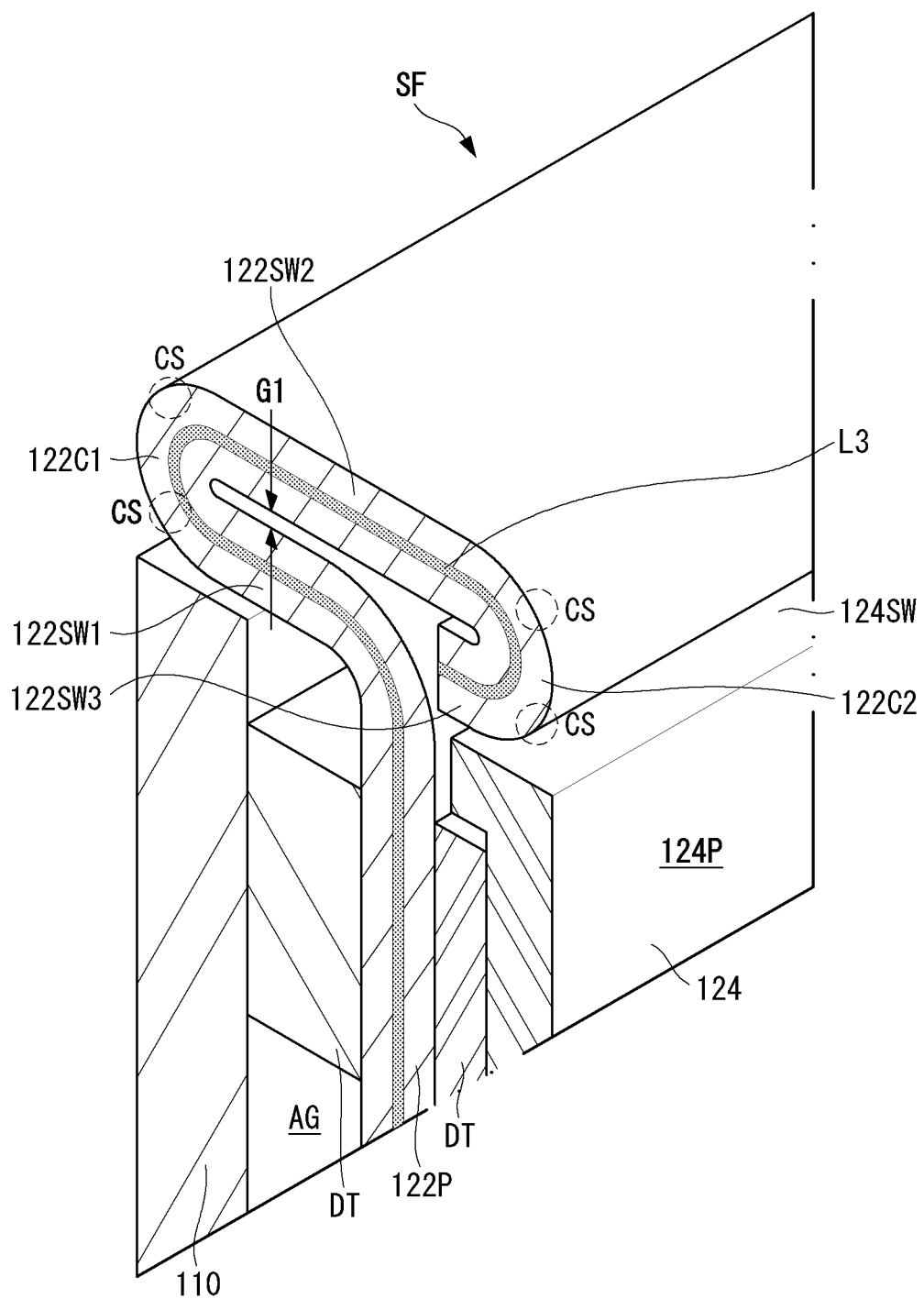

Referring to FIG. 46, the display panel 110 can be coupled with a front surface of a front frame 122. The rear frame 124 can be coupled with a back surface of the front frame 122. The display panel 110 may be attached and fixed to the front frame 122. An adhesive member DT may be fixed to a plate portion 122P of the front frame 122, and a portion of a back surface of the display panel 110 may be attached and fixed to the adhesive member DT.

The front frame 122 can include the plate portion 122P and a side frame SF. The plate portion 122P may face the display panel 110. The adhesive member DT may be attached to a portion of the plate portion 122P. The back surface of the display panel 110 may be attached to the adhesive member DT.

An air gap can be formed between the back surface of the display panel 110 and a front surface of the plate portion 122P. Hence, heat generated in the display panel 110 may be transferred to the plate portion 122P. The heat generated in the display panel 110 may be absorbed in the plate portion 122P and uniformly distributed to the plate portion 122P.

A rear frame 124 can be coupled with a back surface of the front frame 122. The rear frame 124 may be bonded to the back surface of the front frame 122 using an adhesive member DT. The rear frame 124 can include a plate portion 124P and a side wall 124SW. The side wall 124SW can be positioned at an edge or one side of the plate portion 124P. The plate portion 122P of the front frame 122 may have a thickness smaller than the plate portion 124P of the rear frame 124.

For example, a thickness of the plate portion 122P of the front frame 122 may be 0.6 mm, and a thickness of the plate portion 124P of the rear frame 124 may be 0.8 mm. As another example, a thickness of the front frame 122 may be 0.6 mm, and a thickness of the rear frame 124 may be 0.8 mm.

The front frame 122 and the rear frame 124 can be formed of the same material. For example, the front frame 122 and the rear frame 124 can include aluminum (Al). Hence, a twist phenomenon, which can be generated by a difference between thermal expansion coefficients of the front frame 122 and the rear frame 124 in an environment of a high temperature or a low temperature, can be prevented. The front frame 122 and the rear frame 124 may have different colors. Hence, a multitone or multicolor appearance of the display device 100 may be achieved. The multitone or multicolor appearance of the display device 100 may be implemented by painting the front frame 122 and the rear frame 124 with different colors and differently processing the surfaces of the front frame 122 and the rear frame 124 so that they have different textures.

The front frame 122 can include the side frame SF, and the side frame SF can be positioned on one side or at an edge of the plate portion 122P. The side frame SF may be curled. The side frame SF may cover the side of the display panel 110 and/or the side of the rear frame 124 while being curled at the edge of the plate portion 122P.

The side frame SF can include a first side wall 122SW1, a second side wall 122SW2, a third side wall 122SW3, a first bending portion 122C1, and a second bending portion 122C2. The bending portion may be referred to as a curling portion. The first side wall 122SW1 can be extended from an edge of the plate portion 122P. The first side wall 122SW1 can be formed by bending from the plate portion 122P toward the side of the display panel 110.

The second side wall 122SW2 can be positioned in parallel with the first side wall 122SW1. The second side wall 122SW2 may be separated from the first side wall 122SW1 by a predetermined distance G1. The second side wall 122SW2 may be exposed to the outside. Namely, the second side wall 122SW2 may contact an outer air.

The first bending portion 122C1 can be extended from the first side wall 122SW1, bent toward the second side wall 122SW2, and connected to one end of the second side wall 122SW2. The first bending portion 122C1 may be connected to the first side wall 122SW1 and/or the second side wall 122SW2 while forming a curved surface together with the first side wall 122SW1 and/or the second side wall 122SW2.

The third side wall 122SW3 may be adjacent to the side of the rear frame 124. The third side wall 122SW3 may be separated from the side of the rear frame 124. A gap can be formed between the third side wall 122SW3 and a side wall 124SW of the rear frame 124. The third side wall 122SW3 can be positioned inside the second side wall 122SW2. The third side wall 122SW3 can be positioned simultaneously adjacent to the first side wall 122SW1 and/or the plate portion 122P of the front frame 122.

In addition, the side wall 124SW of the rear frame 124 may be inserted between the third side wall 122SW3 and the adhesive member DT. An upper surface of the side wall 124SW of the rear frame 124 may be adjacent to, contact, or face the plate portion 122P of the front frame 122 or the first side wall 122SW1. An inner surface of the side wall 124SW of the rear frame 124 may be adjacent to, contact, or face the adhesive member DT. An outer surface of the rear frame 124 may be adjacent to, contact, or face one surface of the third side wall 122SW3 of the front frame 122.

Hence, the embodiment of the invention can implement the slim structure of the display device 100 while securing the rigidity of the display device 100. Further, because the cutting surface of the rear frame 124 is not exposed to the outside in the embodiment of the invention, a separate process for the cutting surface can be omitted. Hence, the number of manufacturing processes decreases, and the assembly of the display device 100 may be easily performed. Furthermore, a user's injury, a corrosion, a crack, etc., that may be generated by an exposure of the cutting surface of the rear frame 124 to the outside, can be prevented.

The second bending portion 122C2 may connect the second side wall 122SW2 and the third side wall 122SW3. The second bending portion 122C2 can be bent while being extended from the second side wall 122SW2 and connected to the third side wall 122SW3.

The second side wall 122SW2, the first bending portion 122C1, and the second bending portion 122C2 may be exposed to the outer air. While the third side wall 122SW3 and the side or the side wall 124SW of the rear frame 124 form a gap, the outer air may enter into or may be discharged from the inside of the cured side frame SF. As a result, all of the first side wall 122SW1, the second side wall 122SW2, the third side wall 122SW3, the first bending portion 122C1, and the second bending portion 122C2 may be exposed to the outer air. Hence, heat, that is generated in the display panel 110 and is absorbed in the plate portion 122P of the front frame 122, may be efficiently dissipated through the side frame SF.

Figure 47:
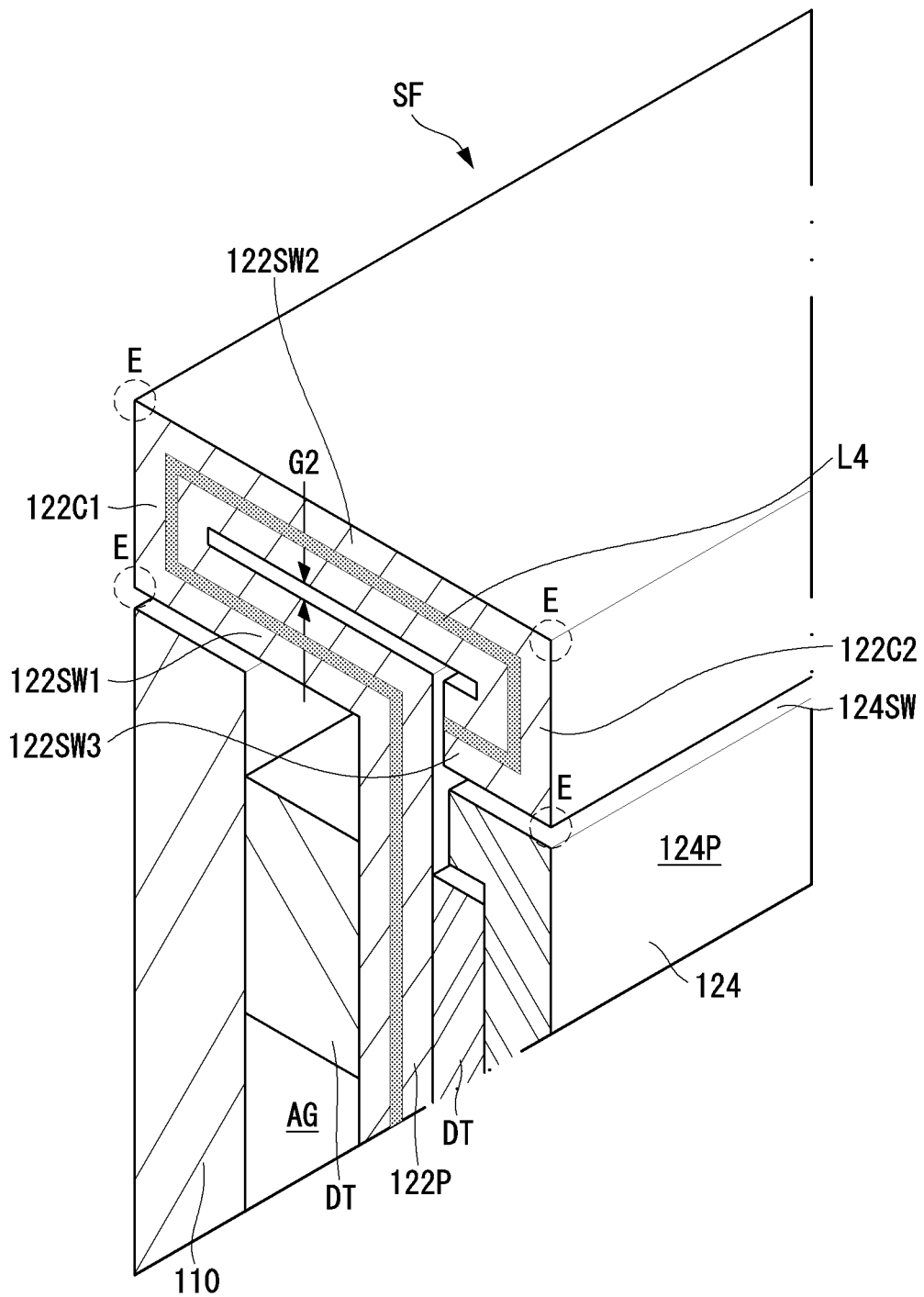

Referring to FIG. 47, a first side wall 122SW1 and a first bending portion 122C1 can form an edge E. The first bending portion 122C1 and a second side wall 122SW2 can form an edge E. The second side wall 122SW2 and a second bending portion 122C2 can form an edge E. The second bending portion 122C2 and a third side wall 122SW3 can form an edge E.

A length L4 of a side frame SF shown in FIG. 47 is longer than a length L3 of the side frame SF shown in FIG. 46. A surface area of the side frame SF exposed to the outer air increases due to the edges E. An increase in the surface area means an improvement in a heat dissipation effect of the front frame 122. A gap (or a distance) G2 between the first side wall 122SW1 and the second side wall 122SW2 in FIG. 47 may be the same as a gap (or a distance) G1 between the first side wall 122SW1 and the second side wall 122SW2 in FIG. 46.

Figure 48:
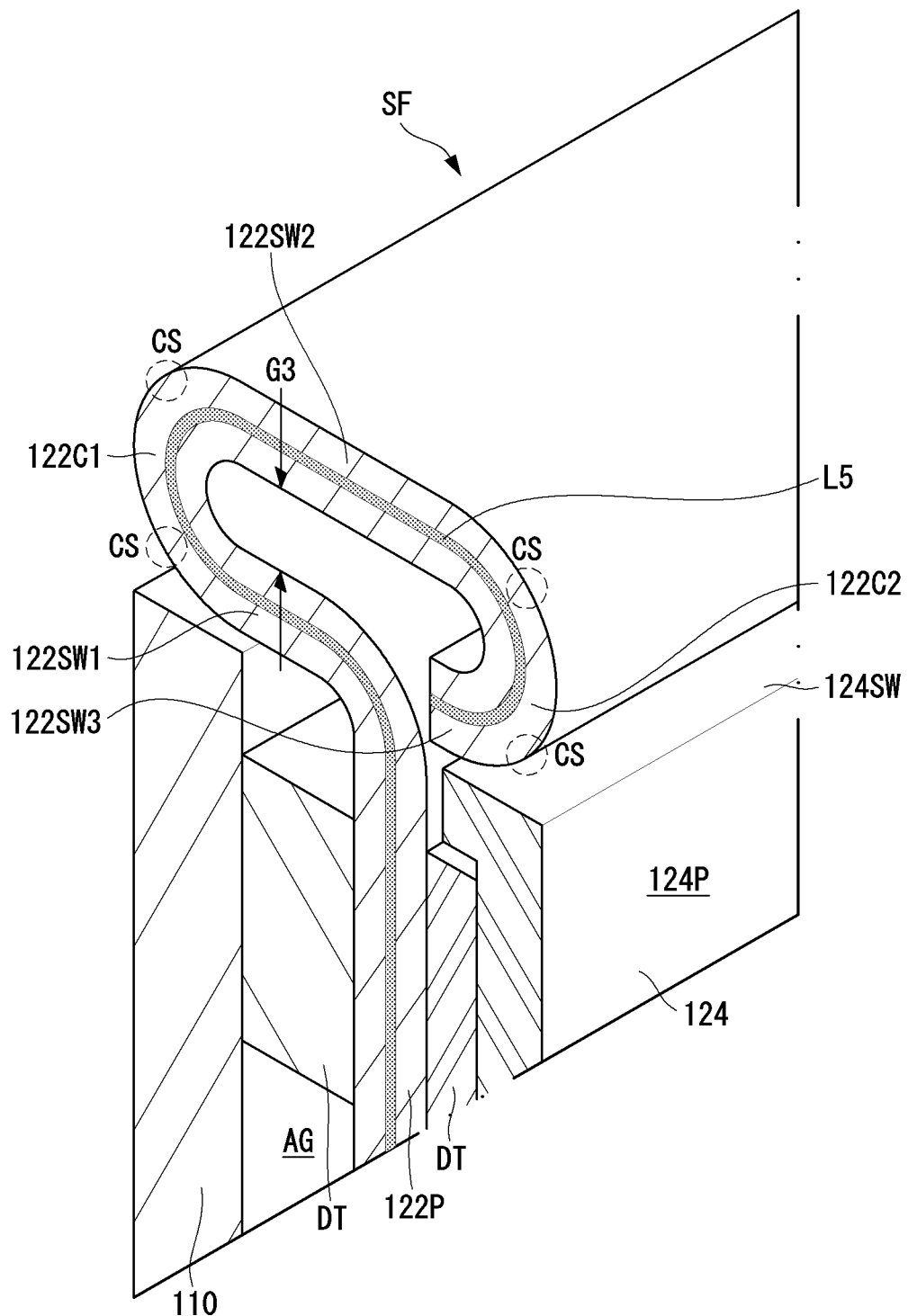

Referring to FIG. 48, a gap (or a distance) G3 between a first side wall 122SW1 and a second side wall 122SW2 may be greater than the gaps (or the distances) G1 and G2 between the first side wall 122SW1 and the second side wall 122SW2 in FIGS. 46 and 47. A length L5 of a side frame SF shown in FIG. 48 may be longer than lengths L3 and L4 of the side frames SF shown in FIGS. 46 and 47. This means an increase in a surface area of the side frame SF exposed to the outer air. Hence, a heat dissipation effect of the front frame 122 is further improved.

Figure 49:
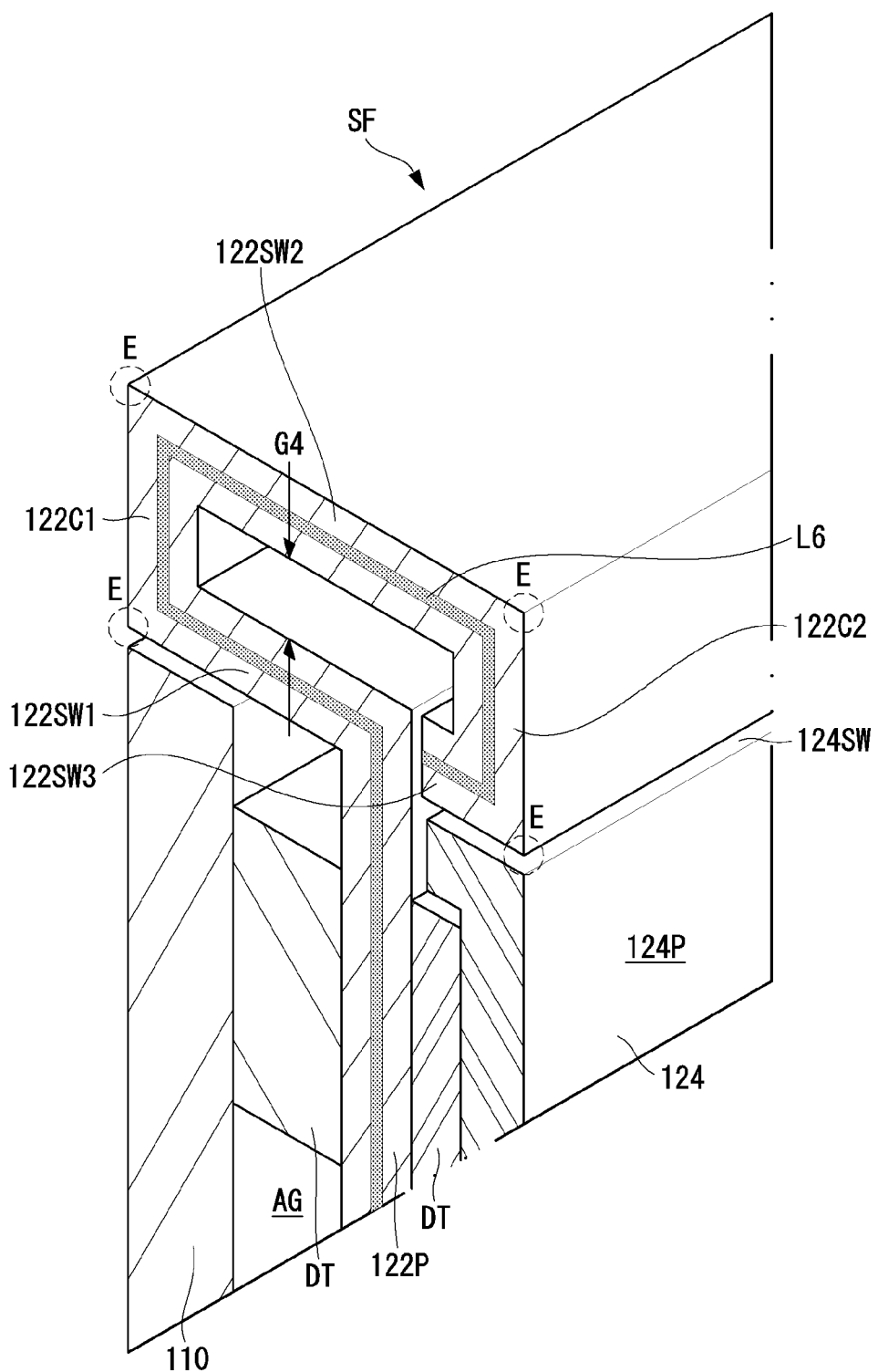

Referring to FIG. 49, a first side wall 122SW1 and a first bending portion 122C1 can form an edge E. The first bending portion 122C1 and a second side wall 122SW2 can form an edge E. The second side wall 122SW2 and a second bending portion 122C2 can form an edge E. The second bending portion 122C2 and a third side wall 122SW3 can form an edge E. A length L6 of a side frame SF shown in FIG. 49 is longer than the length L5 of the side frame SF shown in FIG. 48. A surface area of the side frame SF exposed to the outer air further increases due to the edges E. An increase in the surface area means an improvement in a heat dissipation effect of the front frame 122.

A gap (or a distance) G4 between the first side wall 122SW1 and the second side wall 122SW2 in FIG. 47 may be the same as the gap (or the distance) G3 between the first side wall 122SW1 and the second side wall 122SW2 in FIG. 48.

The foregoing embodiments are merely examples and are not to be considered as limiting the present disclosure. The present teachings can be readily applied to other types of methods and apparatuses. The features, structures, methods, and other characteristics of the embodiments described herein may be combined in various ways to obtain additional and/or alternative embodiments.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a display panel;
   a rear frame in a rear of the display panel; and
   a front frame positioned between the display panel and the rear frame and coupled with the display panel and the rear frame, the front frame including a plate portion facing the display panel and a side frame formed at a side or an edge of the plate portion,
   wherein the side frame includes:
   a first side wall adjacent to a side of the display panel and extended from the plate portion;
   a second side wall facing the first side wall;
   a first bending portion extended from the first side wall and connecting the first side wall to a first end of the second side wall;
   a second bending portion extended from the other end of the second side wall and bent from the second side wall toward the rear frame or the front frame; and
   a third side wall adjacent to a side of the rear frame, separated from the first side wall or the plate portion, and connected to the second bending portion.

2. The display device of claim 1, wherein the front frame has an air path between the first side wall and the second side wall.

3. The display device of claim 1, wherein air enters and discharges from an air path formed by the third side wall being separated from the first side wall or the plate portion and an air gap formed between the first and second side walls and the first and second bending portions.

4. The display device of claim 1, wherein the rear frame is bonded to a back surface of the front frame, and
   wherein the display panel is attached to a front surface of the front frame.

5. The display device of claim 1, wherein the side frame extends along an entire perimeter of the plate portion of the front frame.

6. The display device of claim 1, wherein the side frame has a curved surface, and
   wherein the curved surface is between the first side wall and the first bending portion, between the first bending portion and the second side wall, and between the second side wall and the second bending portion.

7. The display device of claim 1, wherein the side frame has an edge between the first side wall and the first bending portion, between the first bending portion and the second side wall, and between the second side wall and the second bending portion.

8. The display device of claim 1, further comprising:
   a member layer electrically connected to the display panel,
   wherein the front frame includes an opening in the plate portion, and the member layer passes through the plate portion of the front frame through the opening.

9. The display device of claim 1, wherein the rear frame includes a plate portion facing the plate portion of the front frame, and
   wherein the plate portion of the rear frame includes a beam protruding from a back surface of the plate portion of the rear frame.

10. The display device of claim 9, wherein the beam forms a closed loop on the plate portion of the rear frame.

11. The display device of claim 9, further comprising:
    a rigid bar coupled with the beam of the rear frame at a back surface of the rear frame.

12. The display device of claim 1, wherein the front frame and the rear frame include aluminum (Al).

13. The display device of claim 1, wherein the first bending portion and the second bending portion are exposed to the outside.

14. The display device of claim 1, wherein a thickness of the front frame is less than a thickness of the rear frame.

15. The display device of claim 1, wherein the side frame includes at least five bending portions to form an air path.

16. The display device of claim 1, wherein the first side wall has a length less than a length of the second side wall.

17. The display device of claim 1, wherein the first bending portion and the second bending portion have a same length.

18. The display device of claim 1, wherein the first and second side walls and the first and second bending portions are integral.

19. The display device of claim 1, wherein the third bending portion faces an inner area of the display device.

20. The display device of claim 2, wherein the air path includes an air entry and discharge port formed by the third side wall being separated from the first side wall or the plate portion and a rectangular or oval shaped air gap formed between the first and second side walls and the first and second bending portions so heat is discharged to the outside.

* * * * *